(12) United States Patent  (10) Patent No.: US 7,719,387 B2
Sato  (45) Date of Patent: May 18, 2010

(54) MULTILAYER FILTER COMPOSED OF VARISTOR SECTION AND INDUCTOR SECTION

(75) Inventor: Takahiro Sato, Tokyo (JP)

(73) Assignee: TDK Corporation, Tokyo (JP)

( * ) Notice: Subject to any disclaimer, the term of this patent is extended or adjusted under 35 U.S.C. 154(b) by 32 days.

(21) Appl. No.: 12/033,494

(22) Filed: Feb. 19, 2008

(65) Prior Publication Data

US 2008/0238574 A1 Oct. 2, 2008

(30) Foreign Application Priority Data

Mar. 27, 2007 (JP) ............................. 2007-082232

(51) Int. Cl.
 *H03H 7/00* (2006.01)
(52) U.S. Cl. ....................... 333/185; 333/172
(58) Field of Classification Search ................ 333/172, 333/184, 185; 338/61, 218, 254, 283
See application file for complete search history.

(56) References Cited

U.S. PATENT DOCUMENTS

| 7,085,118 B2 * | 8/2006 | Inoue et al. ................. 361/119 |
| 7,277,270 B2 * | 10/2007 | Sato et al. ................. 361/321.1 |
| 2006/0261914 A1 * | 11/2006 | Moriai et al. ............... 333/185 |
| 2007/0002513 A1 * | 1/2007 | Matsuoka et al. ........... 361/118 |
| 2007/0071986 A1 * | 3/2007 | Umeda et al. ............... 428/457 |
| 2009/0097219 A1 * | 4/2009 | Cho et al. ................... 361/763 |

FOREIGN PATENT DOCUMENTS

| JP | A-3-151605 | 6/1991 |
| JP | A-07-220906 | 8/1995 |
| JP | A-2003-051729 | 2/2003 |
| JP | A-2005-064267 | 3/2005 |
| JP | A-2005-134510 | 5/2005 |
| JP | A-2006-013154 | 1/2006 |
| JP | A-2006-041081 | 2/2006 |
| JP | A-2006-041820 | 2/2006 |
| JP | A-2006-115460 | 4/2006 |
| JP | A-2006-140173 | 6/2006 |
| JP | A-2006-310712 | 11/2006 |
| JP | A-2007-500442 | 1/2007 |
| JP | A-2007-43216 | 2/2007 |
| JP | A-2007-194494 | 8/2007 |
| JP | A-2007-195060 | 8/2007 |
| JP | A-2007-227473 | 9/2007 |
| KR | 10-0799096 | 11/2006 |

* cited by examiner

*Primary Examiner*—Robert Pascal
*Assistant Examiner*—Kimberly E Glenn
(74) *Attorney, Agent, or Firm*—Oliff & Berridge, PLC

(57) ABSTRACT

A multilayer filter 1 according to an embodiment of the present invention is a multilayer filter in which an inductor section 7 and a varistor multilayer section 9 are arranged to form an interface P, wherein varistor layers $8_1$-$8_4$ contain ZnO as a major ingredient and additives of at least one element selected from the group consisting of Pr and Bi, Co, and Al, wherein inductor layers $6_1$-$6_9$ contain ZnO as a major ingredient and contains no substantial amount of Co and Al, wherein an inductor diffusion layer 6D contains Li, wherein inductor conductor portions $12_1$-$12_8$ are located 20 μm or more away from the interface P, and wherein varistor conductor portions 16, 17 are located 40 μm or more away from the interface P.

6 Claims, 16 Drawing Sheets

Fig.14

(a) THICKNESS OF LEAD CONDUCTOR PORTION DS3=1.1[μm]

| DISTANCE FROM INTERFACE DS1 [μm] | CAPACITANCE [pF] |
|---|---|
| 0 | 1.61 |
| 17 | 1.58 |
| 40 | 1.21 |
| 88 | 0.55 |
| 97 | 0.42 |

(b) THICKNESS OF LEAD CONDUCTOR PORTION DS3=1.9[μm]

| DISTANCE FROM INTERFACE DS1 [μm] | CAPACITANCE [pF] |
|---|---|
| 0 | 2.38 |
| 16 | 1.36 |
| 42 | 0.48 |
| 95 | 0.46 |
| 103 | 0.42 |

(c) THICKNESS OF LEAD CONDUCTOR PORTION DS3=2.8[μm]

| DISTANCE FROM INTERFACE DS1 [μm] | CAPACITANCE [pF] |
|---|---|
| 0 | 1.99 |
| 21 | 0.51 |
| 36 | 0.43 |
| 96 | 0.47 |
| 106 | 0.42 |

(d) THICKNESS OF LEAD CONDUCTOR PORTION DS3=4.4[μm]

| DISTANCE FROM INTERFACE DS1 [μm] | CAPACITANCE [pF] |
|---|---|
| 0 | 0.98 |
| 18 | 0.39 |
| 36 | 0.42 |
| 92 | 0.42 |
| 105 | 0.43 |

Fig.15

| DISTANCE FROM INTERFACE DS2 [$\mu$m] | CAPACITANCE [pF] |
|---|---|
| 0 | 5.1 |
| 13 | 8.6 |
| 27 | 9.5 |
| 40 | 11.3 |
| 80 | 11.9 |
| 100 | 12.0 |
| 160 | 12.2 |
| 200 | 12.4 |
| 240 | 12.2 |

*Fig.16*

(a) DISTANCE FROM INTERFACE
DS1=32[μm]

| CHANNEL | CAPACITANCE [pF] |
|---|---|
| 1 | 14.55 |
| 2 | 14.67 |
| 3 | 14.76 |
| 4 | 14.61 |

(b) DISTANCE FROM INTERFACE
DS1=86[μm]

| CHANNEL | CAPACITANCE [pF] |
|---|---|
| 1 | 14.85 |
| 2 | 15.02 |
| 3 | 14.99 |
| 4 | 14.77 |

(c) DISTANCE FROM INTERFACE
DS1=107[μm]

| CHANNEL | CAPACITANCE [pF] |
|---|---|
| 1 | 14.67 |
| 2 | 15.86 |
| 3 | 15.79 |
| 4 | 14.86 |

(d) DISTANCE FROM INTERFACE
DS1=121[μm]

| CHANNEL | CAPACITANCE [pF] |
|---|---|
| 1 | 14.89 |
| 2 | 16.32 |
| 3 | 16.48 |
| 4 | 15.01 |

MULTILAYER FILTER COMPOSED OF VARISTOR SECTION AND INDUCTOR SECTION

BACKGROUND OF THE INVENTION

1. Field of the Invention

The present invention relates to a multilayer filter.

2. Related Background Art

The electronic devices are recently being developed toward higher frequencies of transmitted signals for faster operation, lower voltages for power saving, and so on. Under such circumstances, the technology of removing noise, surge, etc. has increasingly been becoming important for the electronic devices from the viewpoint of ensuring excellent reliability. Consequently, a multilayer filter composed of a varistor section and an inductor section is attracting attention as an element capable of removing both of noise and surge in the form of a single chip.

An example of the known multilayer filters of this type is a composite functional element obtained by joining a semiconductor porcelain and a magnetic porcelain together and integrally sintering them (e.g., cf. Japanese Patent Application Laid-open No. 7-220906).

SUMMARY OF THE INVENTION

In the conventional multilayer filter described above, however, the material making the laminate of the varistor section is different from that of the inductor section and therefore they show a great difference in volume change during the sintering. For this reason, stress tended to appear at the interface between them during the integral sintering. Then this raised a problem that the varistor section and the inductor section were likely to delaminate from each other.

Therefore, the inventors first attempted to make the inductor section from the same material as the laminate of the varistor section in order to reduce the delamination of the varistor section and the inductor section in the multilayer filter. As a result, the inventors found that the varistor section and the inductor section became very much unlikely to delaminate, even in the case where they were integrally sintered.

However, the material making the laminate of the varistor section normally has the characteristic of extremely low resistance and is unsuitable for the material of the inductor. Therefore, it was difficult to apply this multilayer filter to usage at high frequencies.

The inventors conducted further research based on this finding and discovered that the laminate of the inductor part came to have high resistance where the inductor section was composed of the laminate of the same material as the constituent material of the varistor section and the two constituent materials contained different additives. However, when the inventors actually made the multilayer filter of this composition by way of trial, we found that the high frequency characteristic degraded in certain cases.

An object of the present invention is therefore to provide a multilayer filter capable of reducing the delamination of the inductor section and the varistor section and suppressing the degradation of the high frequency characteristic.

A multilayer filter according to the present invention is a multilayer filter comprising: an inductor section with an inductor conductor portion being formed in an inductor layer; and a varistor section with a varistor conductor portion being formed in a varistor layer, the inductor section and the varistor section being arranged so as to form an interface; (a) wherein the varistor layer contains ZnO as a major ingredient and additives of at least one element selected from the group consisting of Pr and Bi, Co, and Al; (b) wherein the inductor layer contains ZnO as a major ingredient and contains no substantial amount of Co and Al; (c) wherein a diffusion layer is formed on the interface side in the inductor layer and contains Li; (d) wherein the inductor conductor portion is located 20 μm or more away from the interface; and (e) wherein the varistor conductor portion is located 40 μm or more away from the interface.

In this multilayer filter, since the inductor layer and the varistor layer contain the same material (ZnO) as their major ingredient, the stress or the like based on the difference between volume change rates of laminates is unlikely to appear between the two layers during integral sintering of these layers. Consequently, the delamination of the inductor section and the varistor section is drastically reduced.

The material making the inductor layer, i.e., the material containing ZnO as the major ingredient and containing no substantial amount of Co and Al, has characteristics of extremely high resistivity and low permittivity when compared with ZnO itself and the constituent material of the varistor layer (ZnO and the additives of Pr or Bi, Co, and Al). This multilayer filter has the inductor section with excellent inductor characteristic accordingly.

If Co and Al in the varistor layer diffuse into the inductor layer during the integral sintering of the inductor section and the varistor section, Co will act to increase the permittivity, while Al will act to decrease the resistivity. Therefore, the permittivity (or capacitance) will increase and the resistivity will decrease in the diffusion layer on the interface side to the varistor layer in the inductor layer. It will result in degradation of the inductor characteristic of the inductor section and degradation of the high frequency characteristic of the multilayer filter. In this case, it was found by the inventors' research that the inductor conductor portion had to be located 100 μm or more away from the interface, in order to suppress the degradation of the inductor characteristic of the inductor section.

In the multilayer filter, however, since the diffusion layer in the inductor layer contains Li, the increase in the permittivity of the diffusion layer is well suppressed. As a consequence, it is feasible to suppress the degradation of the inductor characteristic of the inductor section due to the diffusion of Co and Al, even in a case where the inductor conductor portion is located as close as 20 μm from the interface. Therefore, this multilayer filter is able to suppress the degradation of the high frequency characteristic and to achieve downsizing.

On the other hand, Co and Al decease in the diffusion layer on the interface side to the inductor layer in the varistor layer during the integral sintering of the inductor section and the varistor section, to lower the permittivity (or capacitance) and thus the varistor layer will fail substantially to demonstrate the varistor function. In the multilayer filter, however, since the varistor conductor portion is located 40 μm or more away from the interface, the varistor conductor portion can be placed away from the diffusion layer in the varistor layer. Therefore, it is feasible to suppress the degradation of the varistor characteristic of the varistor section and to suppress the degradation of the high frequency characteristic of the multilayer filter.

In the foregoing multilayer filter, preferably, for diffusing the Li from a surface into the diffusion layer of the inductor conductor portion, a lead conductor portion of the inductor conductor portion to the surface has a thickness of nor less than 3 μm.

In this configuration, the lead conductor portion of the inductor conductor portion has the large thickness of not less than 3 μm, so that Li can be appropriately diffused from the surface into the diffusion layer of the inductor conductor portion through the clearance around the inductor conductor portion.

In the foregoing multilayer filter, preferably, a separation distance between the inductor conductor portion and the interface is not more than 100 μm.

The electric field coupling takes place between the inductor conductor portion and the varistor conductor portion. In the case of an array type multilayer filter in which a plurality of filter elements are arrayed in a row, an inner filter element tends to have a larger distribution width of an electric field distribution than an outer filter element. This results in increasing element variation (interchannel variation) in parasitic capacitance and increasing element variation (interchannel variation) in high frequency characteristic.

In the above-described configuration, however, the separation distance between the inductor conductor portion and the interface is as short as not more than 100 μm; that is, the separation distance between the inductor conductor portion and the varistor conductor portion is small, so that the increase in the distribution width of the electric field distribution can be reduced, particularly, in the inner filter element. Therefore, this configuration reduces the element variation in parasitic capacitance and the element variation in high frequency characteristic.

Preferably, the foregoing varistor conductor portion has a pair of hot electrodes connected to two ends of the inductor conductor portion, respectively, and a ground electrode, and the pair of hot electrodes are located 100 μm or more away from each other on one plane in the varistor layer.

In this configuration, the pair of hot electrodes in the varistor section in a π type multilayer filter are located on the same plane in the varistor layer, and thus the number of layers in the varistor section can be reduced. It is thus feasible to achieve further downsizing of the multilayer filter.

Furthermore, the pair of hot electrodes are spaced 100 μm or more from each other, which can reduce the increase in capacitance parasitic between input and output of the π type multilayer filter. Therefore, it becomes feasible to further suppress the degradation of the high frequency characteristic of the multilayer filter.

Preferably, the foregoing varistor conductor portion has a hot electrode connected to the inductor conductor portion, and a pair of ground electrodes, and the hot electrode is located between the pair of ground electrodes so as to face the pair of ground electrodes in a stack direction of the inductor section and the varistor section.

In this configuration, the hot electrode in the varistor section is located between the pair of ground electrodes, which can reduce the increase in capacitance parasitic on the hot electrode side of the varistor section. As a result, it becomes feasible to further suppress the degradation of the high frequency characteristic of the multilayer filter.

As described above, the present invention provides the multilayer filter capable of reducing the delamination of the inductor section and the varistor section and suppressing the degradation of the high frequency characteristic.

BRIEF DESCRIPTION OF THE DRAWINGS

FIG. 14 is a drawing showing the evaluation results of capacitances of multilayer filters in Example 1.

FIG. 15 is a drawing showing the evaluation results of capacitances of multilayer filters in Example 1.

FIG. 16 is a drawing showing the evaluation results of capacitances of multilayer filters in Example 2.

DESCRIPTION OF THE PREFERRED EMBODIMENTS

Figure 1:
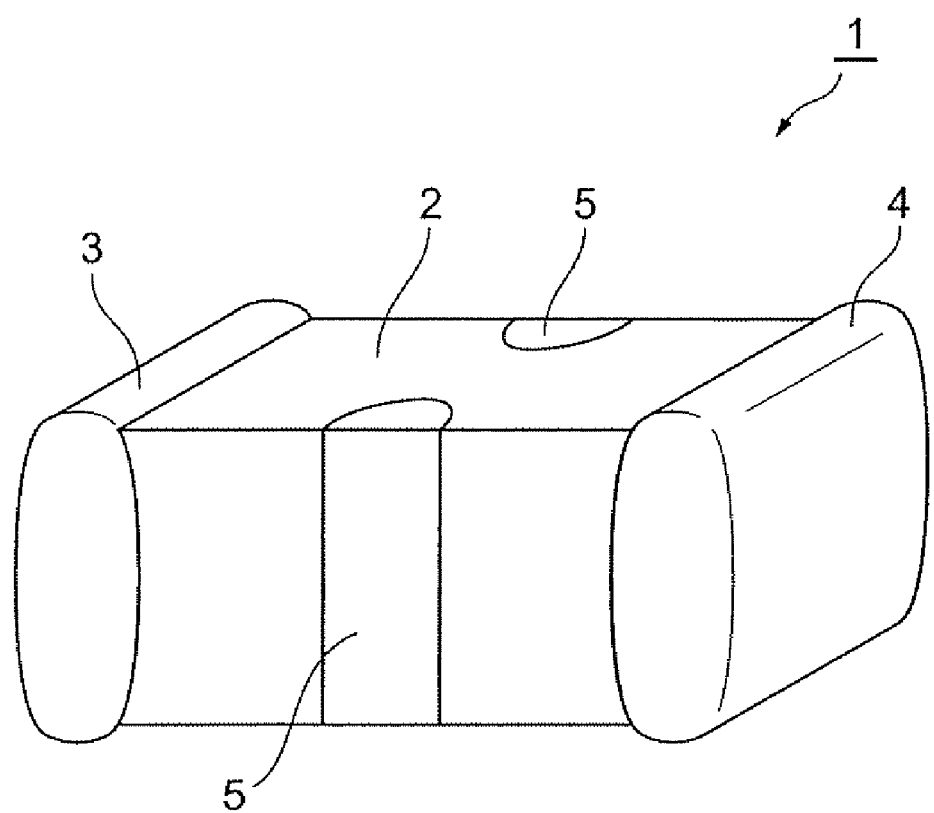
FIG. 1 is a perspective view showing a multilayer filter according to the first embodiment.

The preferred embodiments of the present invention will be described below in detail with reference to the drawings. Identical or equivalent portions will be denoted by the same reference symbols in the drawings.

First Embodiment

Figure 2:
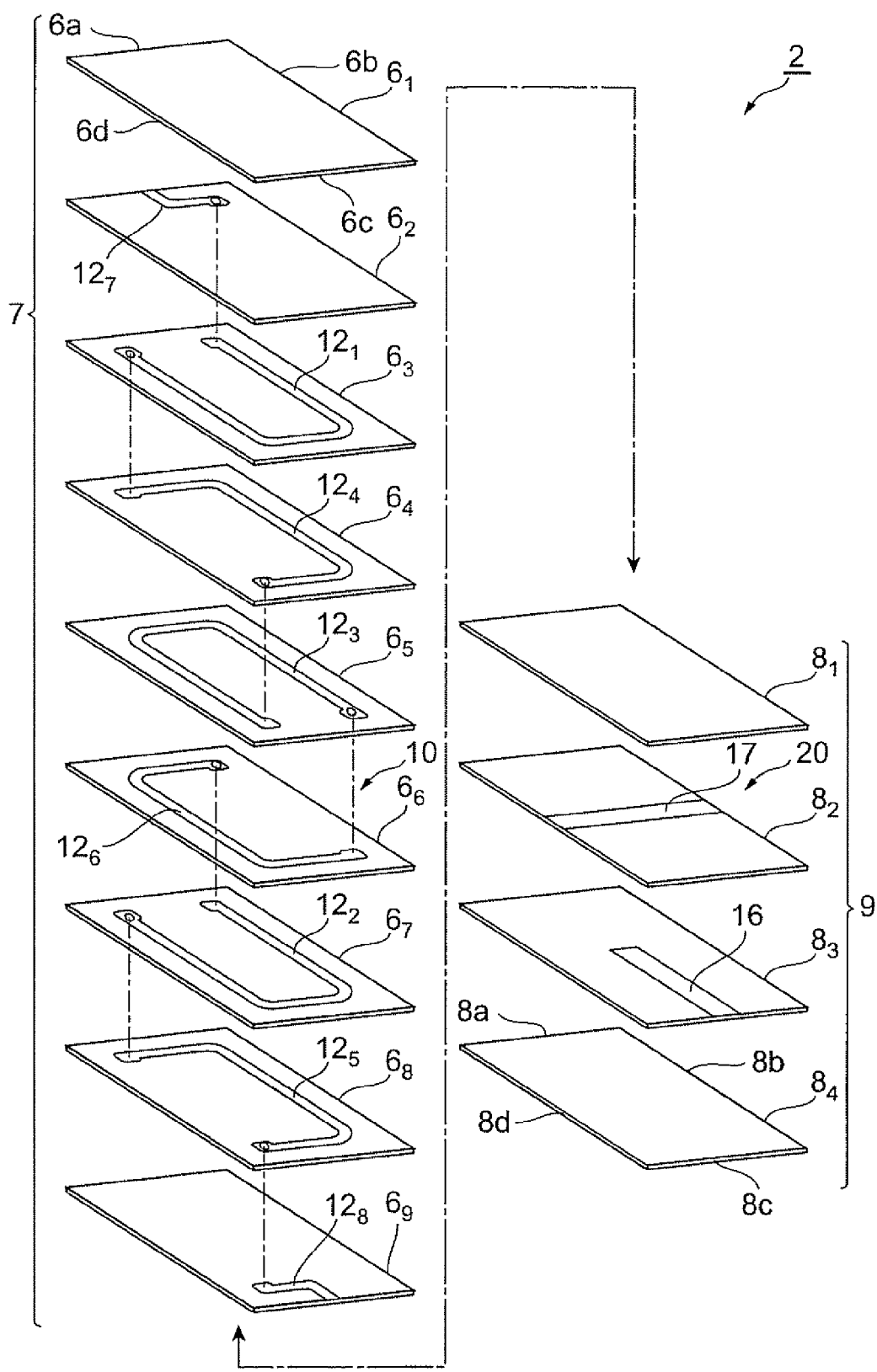
FIG. 2 is an exploded perspective view showing a separated state of a laminate of the multilayer filter according to the first embodiment.
Figure 3:
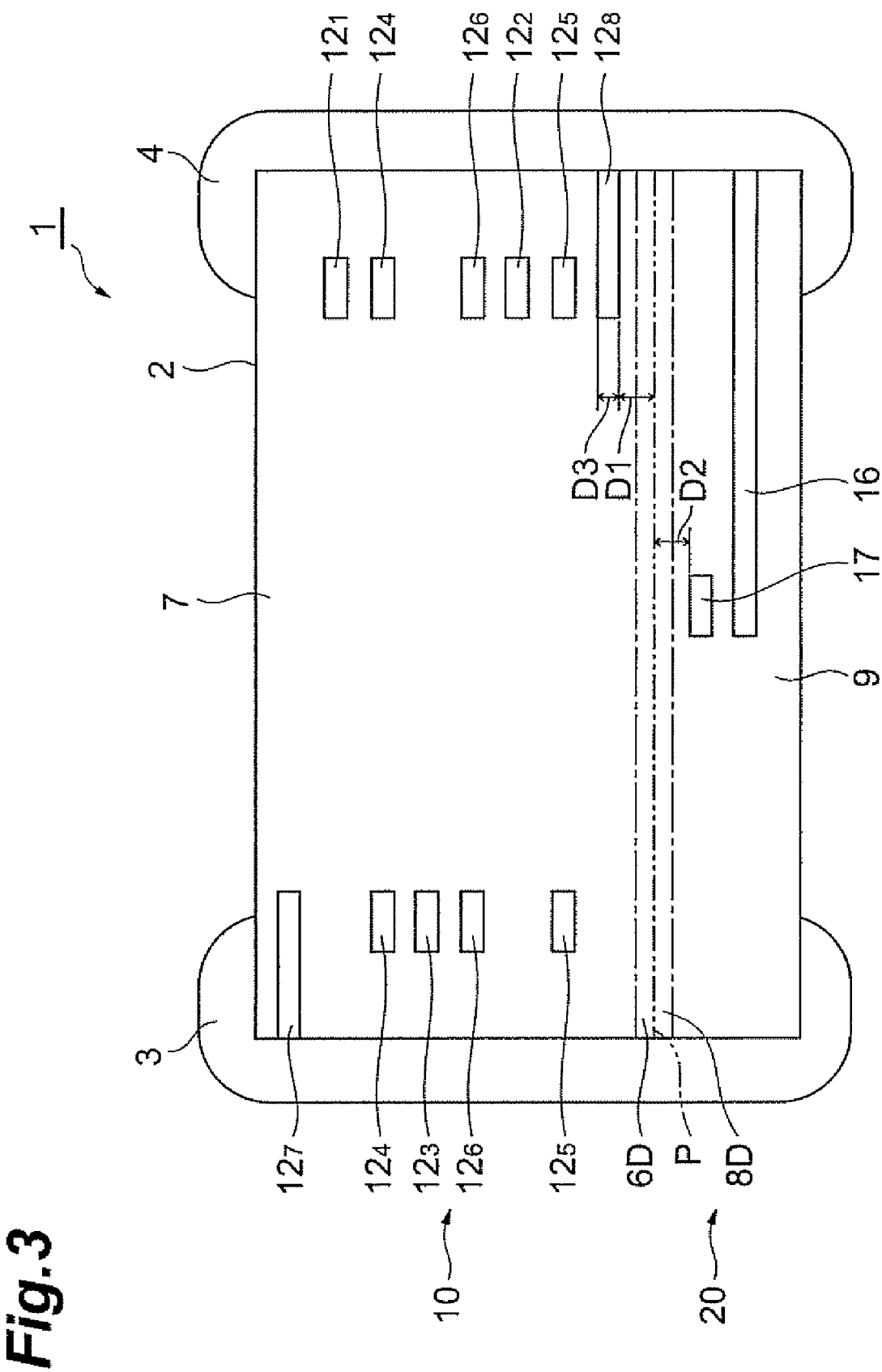
FIG. 3 is a sectional view showing a center cross section of the multilayer filter according to the first embodiment.

FIG. 1 is a perspective view showing a multilayer filter according to the first embodiment and FIG. 2 an exploded perspective view showing a separated state of a laminate of the multilayer filter according to the first embodiment. FIG. 3 is a sectional view showing a central cross section of the multilayer filter according to the first embodiment and FIG. 4 a circuit diagram of the multilayer filter according to the first embodiment. The cross section in FIG. 3 is a plane parallel to the longitudinal direction and the stack direction of the laminate 2.

As shown in FIG. 1, the multilayer filter 1 comprises the laminate 2 of a rectangular parallelepiped shape. In the laminate 2, an input terminal electrode 3 and an output terminal electrode 4 are formed at both ends in the longitudinal direction of the laminate and a pair of ground terminal electrodes 5 are formed at both ends in the direction perpendicular to the longitudinal direction.

As shown in FIGS. 2 and 3, the laminate 2 includes an inductor multilayer section (inductor section) 7 consisting of a stack of inductor layers $6_1$-$6_9$, and a varistor multilayer section (varistor section) 9 consisting of a stack of varistor layers $8_1$-$8_4$. The inductor multilayer section 7 and the varistor multilayer section 9 are arranged to form an interface P. The interface P is formed between the inductor layer $6_9$ and the varistor layer $8_1$ in the laminate 2.

The inductor layers $6_1$-$6_9$ are made of an electrically insulating material and in a rectangular thin plate shape and have edges 6a, 6b, 6c, and 6d clockwise from the edge where the input terminal electrode 3 is formed. The inductor layers $6_1$-$6_9$ are made of a ceramic material containing ZnO as a major ingredient.

The ceramic material making the inductor layers $6_1$-$6_9$ may contain additives of metal elements such as Pr, K, Na, Cs, and Rb, in addition to ZnO. Among them, a particularly preferred additive is Pr. When Pr is added, it is easy to reduce the difference between volume change rates of the inductor layers $6_1$-$6_9$ and the varistor layers $8_1$-$8_4$. The inductor layers $6_1$-$6_9$ may further contain Cr, Ca, or Si for improving the adhesion to the varistor multilayer section 9.

These metal elements contained in the inductor layers $6_1$-$6_9$ can exist in various forms such as single metals or oxides. A preferred content of the additives contained in the inductor layers $6_1$-$6_9$ is preferably not less than 0.02 mol % nor more than 2 mol %, relative to the total amount of ZnO contained in the inductor layers. The content of these metal elements can be measured, for example, with an inductively coupled plasma-atomic emission spectrometer (ICP).

The inductor layers $6_1$-$6_9$ contain no substantial amount of Co and Al which are contained in the below-described varistor layers $8_1$-$8_4$. It is noted herein that a state of "contain no substantial amount" refers to a state in which these elements are not intentionally contained as raw materials in production of the inductor layers $6_1$-$6_9$. For example, a case where these elements are unintentionally contained, for example, because of diffusion from the varistor multilayer section 9 into the inductor multilayer section 7 corresponds to the state of "contain no substantial amount." The inductor layers $6_1$-$6_9$ may further contain any other metal element or the like, e.g., for further improvement in characteristics as long as the above-described conditions are met.

The varistor layers $8_1$-$8_4$ are formed in a rectangular thin plate shape and have edges 8a, 8b, 8c, and 8d clockwise from the edge where the input terminal electrode 3 is formed. The varistor layers $8_1$-$8_4$ are made of a ceramic material containing ZnO as a major ingredient.

This ceramic material further contains at least one element selected from the group consisting of Pr and Bi, Co, and Al as additives. Since the varistor layers $8_1$-$8_4$ contain Co in addition to Pr, they have an excellent nonlinear current-voltage characteristic and high permittivity ($\epsilon$). Since they further contain Al, they have low resistance.

The metal elements as the additives in the varistor layers $8_1$-$8_4$ can exist in such forms as single metals or oxides in the varistor layers $8_1$-$8_4$. The varistor layers $8_1$-$8_4$ may further contain any additive such as a metal element (e.g., Cr, Ca, Si, K, or the like) other than the above-described additives, for further improvement in characteristics.

When the inductor layers $6_1$-$6_9$ and the varistor layers $8_1$-$8_4$ are made of their respective constituent materials in the same constitution as described above, delamination can be prevented between the inductor multilayer section 7 and the varistor multilayer section 9. The inductor layers $6_1$-$6_9$ and the varistor layers $8_1$-$8_4$ will be described below in more detail.

The inductor layers $6_1$-$6_8$ are made without additives of Co and Al so as to contain neither of Co and Al. Therefore, the inductor layers $6_1$-$6_8$ have small permittivity and high resistivity and thus have extremely favorable characteristics as the constituent material of the inductor layers.

The inductor layer $6_9$ is made of a material containing neither of Co and Al, without additives of Co and Al, as the inductor layers $6_1$-$6_8$ are. However, Co and Al in a varistor green sheet for varistor layer $8_1$ diffuse into an inductor green sheet for inductor layer $6_9$ in a production process. Namely, the inductor layer $6_9$ has an inductor diffusion layer 6D containing Co and Al, along the interface P.

The inductor diffusion layer 6D further contains Li. However, this Li is not one added as a raw material in these layers, but it is one added by diffusion in a production method as described below, in such a manner that, after production of the laminate 2 with the inductor multilayer section 7 and the varistor multilayer section 9, a raw material containing Li is attached to the surface of this laminate 2 and it is made to diffuse.

Since the inductor diffusion layer 6D contains Co and Al, its permittivity would be higher than that of the inductor layers $6_1$-$6_8$, which could result in impeding the inductor function, but it further contains Li to suppress the increase of permittivity and thus to suppress the impediment of the inductor function.

It is noted that Li may be diffused throughout the inductor layers $6_1$-$6_9$ in the inductor multilayer section 7. This improves the inductor characteristic in the inductor multilayer section 7.

On the other hand, the varistor layer $8_1$ is made of a material similar to the varistor layers $8_2$-$8_4$. However, Co and Al contained in the varistor green sheet for varistor layer $8_1$ diffuse into the inductor green sheet for inductor layer $6_9$ in the production process. Namely, the varistor layer $8_1$ has a varistor diffusion layer 8D having the content of Co and Al lower than that in the varistor layers $8_2$-$8_4$, along the interface P.

The decrease in the content of Co and Al in the varistor diffusion layer 8D makes the permittivity thereof lower than that of the varistor layers $8_2$-$8_4$, so as to degrade the varistor function.

It is desirable in the varistor multilayer section 9 that Li should be as little as possible in a region of the varistor layer $8_2$ between a hot electrode 16 and a ground electrode 17. Since the present embodiment adopts the method of diffusing Li from the surface of the laminate 2 as described above, diffusion of Li is extremely little to the foregoing region of the varistor layer $8_2$ and this region is in a state in which it substantially contains no Li.

In the inductor multilayer section 7, an inductor conductor portion $12_1$ or $12_2$ is formed so as to extend along the edge 6b, edge 6c, and edge 6d on each of the inductor layers $6_3$, $6_7$, and an inductor conductor portion $12_3$ is formed so as to extend along the edge 6d, edge 6a, and edge 6b on the inductor layer $6_5$. An inductor conductor portion $12_4$ or $12_5$ is formed so as to extend along the edge 6a, edge 6b, and edge 6c on each of the inductor layers $6_4$, $6_8$, and an inductor conductor portion $12_6$ is formed so as to extend along the edge 6c, edge 6d, and edge 6a on the inductor layer $6_6$. Furthermore, an inductor conductor portion $12_7$ is formed so as to be connected to the input terminal electrode 3, on the inductor layer $6_2$, and an inductor conductor portion $12_8$ is formed so as to be connected to the output terminal electrode 4, on the inductor layer $6_9$.

An end of the inductor conductor portion $12_1$ on the edge 6d side and the edge 6a side is electrically connected through a through hole formed in the inductor layer $6_3$, to an end of the inductor conductor portion $12_4$ on the edge 6d side and the edge 6a side. An end of the inductor conductor portion $12_4$ on the edge 6c side and the edge 6d side is electrically connected through a through hole formed in the inductor layer $6_4$, to an end of the inductor conductor portion $12_3$ on the edge $6c$ side and the edge $6d$ side, and an end of the inductor conductor portion $12_3$ on the edge $6b$ side and the edge $6c$ side is electrically connected through a through hole formed in the inductor layer $6_5$, to an end of the inductor conductor portion $12_6$ on the edge $6b$ side and the edge $6c$ side. Furthermore, an end of the inductor conductor portion $12_6$ on the edge $6a$ side and the edge $6b$ side is electrically connected through a through hole formed in the inductor layer $6_6$, to an end of the inductor conductor portion $12_2$ on the edge $6a$ side and the edge $6b$ side, and an end of the inductor conductor portion $12_2$ on the edge $6d$ side and the edge $6a$ side is electrically connected through a through hole formed in the inductor layer $6_7$, to an end of the inductor conductor portion $12_5$ on the edge $6d$ side and the edge $6a$ side.

The ends of the inductor conductor portion $12_7$ and the inductor conductor portion $12_1$ on the edge $6a$ side and the edge $6b$ side are electrically connected to each other through a through hole formed in the inductor layer $6_2$, and the ends of the inductor conductor portion $12_8$ and the inductor conductor portion $12_5$ on the edge $6c$ side and the edge $6d$ side are electrically connected to each other through a through hole formed in the inductor layer $6_8$.

As described above, the multilayer filter 1 comprises an inductor 10 including a coil in the structure in which the plurality of inductor conductor portions $12_1$-$12_8$ in the inductor multilayer section 7 are electrically connected. The series of inductor conductor portions $12_1$-$12_8$ are electrically connected at one end to the input terminal electrode 3 and electrically connected at the other end to the output terminal electrode 4. The inductor conductor portions $12_1$-$12_8$ are made of a material containing Ag and Pd.

In the varistor multilayer section 9, the hot electrode (varistor conductor portion) 16 is formed on the varistor layer $8_3$ so as to extend in the central region thereof and along the edge $8b$ and one end thereof reaches the edge $8c$ to be electrically connected to the output terminal electrode 4. The ground electrode (varistor conductor portion) 17 is formed on the varistor layer $8_2$ so as to extend in the central region thereof and along the edge $8a$ and the two ends thereof reach the edge $8b$ and the edge $8d$, respectively, to be electrically connected to the ground terminal electrodes 5.

As constructed in this manner, the multilayer filter 1 comprises a varistor 20 including a pair of varistor electrodes in the structure in which the hot electrode 16 electrically connected to the output terminal electrode 4 and the ground electrode 17 electrically connected to the ground terminal electrodes 5 are formed with the varistor layer $8_2$ in between in the varistor section. The hot electrode 16 and the ground electrode 17 are made of a material containing Ag and Pd.

The inductor conductor portions $12_1$-$12_8$ are formed on the respective inductor layers $6_2$-$6_9$ and are formed as located 20 μm or more away from the interface P between the inductor multilayer section 7 and the varistor multilayer section 9. Namely, the thickness D1 of the inductor layer $6_9$ located between the inductor conductor portion $12_8$ and the varistor multilayer section 9 is not less than 20 μm.

The hot electrode 16 and the ground electrode 17 are formed with the varistor layer $8_2$ in between and are formed as located 40 μm or more away from the interface P between the inductor multilayer section 7 and the varistor multilayer section 9. Namely, the thickness D2 of the varistor layer $8_1$ located between the ground electrode 17 and the inductor multilayer section 7 is not less than 40 μm.

The inductor conductor portion $12_7$ and inductor conductor portion $12_8$ function as lead wire portions to the surface of the laminate 2 among the inductor conductor portions $12_1$-$12_8$ and the thickness D3 of the inductor conductor portion $12_8$ in the stack direction is not less than 3 μm. This facilitates the diffusion of Li from the surface of the laminate 2 into the inductor diffusion layer 6D through the clearance around the inductor conductor portion $12_8$. The thickness of the inductor conductor portion $12_7$ in the stack direction may also be not less than 3 μm. This facilitates the diffusion of Li from the surface of the laminate 2 into the inductor layers $6_2$-$6_9$ through the clearance around the inductor conductor portion $12_7$.

A production method of the above-described multilayer filter 1 will be described below.

First, inductor green sheets for inductor layers $6_1$-$6_9$ are prepared. The inductor green sheets are made, for example, by preparing a slurry from raw materials of mixed powders of ZnO, $Pr_6O_{11}$, $Cr_2O_3$, $CaCO_3$, $SiO_2$, and $K_2CO_3$ and applying the slurry onto a film by the doctor blade method.

The inductor green sheets for inductor layers $6_1$-$6_8$ are formed, for example, by applying the slurry in the thickness of about 20 μm. The inductor green sheet for inductor layer $6_9$ is formed by suitably stacking inductor green sheets each of which is composed of a coating approximately 20 μm thick, so that the thickness D1 after baked becomes not less than 20 μm.

Varistor green sheets for varistor layers $8_1$-$8_4$ are further prepared. The varistor green sheets are formed, for example, by preparing a slurry from raw materials of mixed powders of ZnO, $Pr_6O_1$, CoO, $Cr_2O_3$, $CaCO_3$, $SiO_2$, $K_2CO_3$, and $Al_2O_3$ and applying the slurry onto a film by the doctor blade method.

The varistor green sheets for varistor layers $8_2$-$8_4$ are formed, for example, by applying the slurry in the thickness of about 30 μm. The varistor green sheet for varistor layer $8_1$ is formed by suitably stacking varistor green sheets each of which is composed of a coating approximately 30 μm thick, so that the thickness D2 after baked becomes not less than 40 μm.

Subsequently, through holes are formed by laser machining or the like at predetermined positions in the inductor green sheets for inductor layers $6_2$-$6_8$ (i.e., at the positions where the through holes should be formed in the inductor conductor portions $12_1$-$12_7$).

Thereafter, conductor patterns corresponding to the inductor conductor portions $12_1$-$12_8$ are formed on the inductor green sheets for inductor layers $6_2$-$6_9$. The conductor patterns are formed by screen-printing a conductor paste consisting mainly of Ag and Pd, on the inductor green sheets. The inductor conductor portions $12_7$, $12_8$ functioning as lead wires are formed so that the thickness after baked becomes not less than 3 μm. The other inductor conductor portions $12_1$-$12_6$ are formed, for example, so that the thickness after baked becomes about 8 μm. The through holes formed in the inductor green sheets for inductor layers $6_2$-$6_8$ are filled with a conductor paste by screen printing of the conductor paste onto the inductor green sheets.

Conductor patterns corresponding to the hot electrode 16 and the ground electrode 17 are formed on the varistor green sheets for varistor layers $8_2$, $8_3$. The conductor patterns are formed by screen-printing a conductor paste consisting mainly of Ag and Pd, on the varistor green sheets and, for example, formed so that the thickness after baked becomes about 1.5 μm.

Subsequently, the inductor green sheets for inductor layers $6_1$-$6_9$ and the varistor green sheets for varistor layers $8_1$-$8_4$ are stacked in the predetermined order, and the stack is pressed under pressure and cut in chip unit. Thereafter, it is baked at a predetermined temperature (e.g., a temperature of about 1100-1200° C.) to obtain the laminate 2.

On this occasion, Co and Al diffuse from the varistor green sheet laid adjacent to the inductor green sheet, into the inductor green sheet to form the diffusion layers near the interface P between the inductor green sheet and the varistor green sheet. Namely, the diffusion results in forming the inductor diffusion layer 6D containing Co and Al, and the varistor diffusion layer with the decreased content of Co and Al.

Next, Li is made to diffuse through the clearances around the inductor conductor portions $12_7$, $12_8$ from the surface of the resultant laminate 2 into the inductor layers $6_1$-$6_9$. Particularly, Li is made to diffuse through the clearance around the inductor conductor $12_8$ from the surface of the laminate 2 into the inductor diffusion layer 6D. In this step, a Li compound is attached to the surface of the resultant laminate 2 and thereafter a thermal treatment or the like is carried out. A closed rotary pot can be used for attaching the Li compound. There are no particular restrictions on the Li compound, but it can be any compound that permits Li to diffuse from the surface of the laminate 2 into the interior thereof by the thermal treatment; for example, it can be selected from an oxide, a hydroxide, a chloride, a nitrate, a borate, a carbonate, an oxalate, and others of Li.

In this manner, the inductor diffusion layer 6D comes to contain Li in addition to Co and Al. In addition, the inductor conductor portions $12_1$-$12_8$ come to be located 20 μm or more away from the interface P, and the hot electrode 16 and the ground electrode 17 come to be located 40 μm or more away from the interface P.

Subsequently, the input terminal electrode 3, output terminal electrode 4, and ground terminal electrodes 5 are formed on the exterior of the laminate 2 to complete the multilayer filter 1. Each of the terminal electrodes 3-5 is formed by transferring a conductor paste consisting mainly of Ag, onto the exterior of the laminate 2, baking it at a predetermined temperature (e.g., a temperature of 700° C.-800° C.), and further electroplating the baked undercoat with Ni/Sn, Cu/Ni/Sn, Ni/Au, Ni/Pd/Au, Ni/Pd/Ag, or Ni/Ag. The size of the completed multilayer filter 1 is 1.0 mm in length, 0.5 mm in width, and 0.5 mm in thickness.

Figure 4:
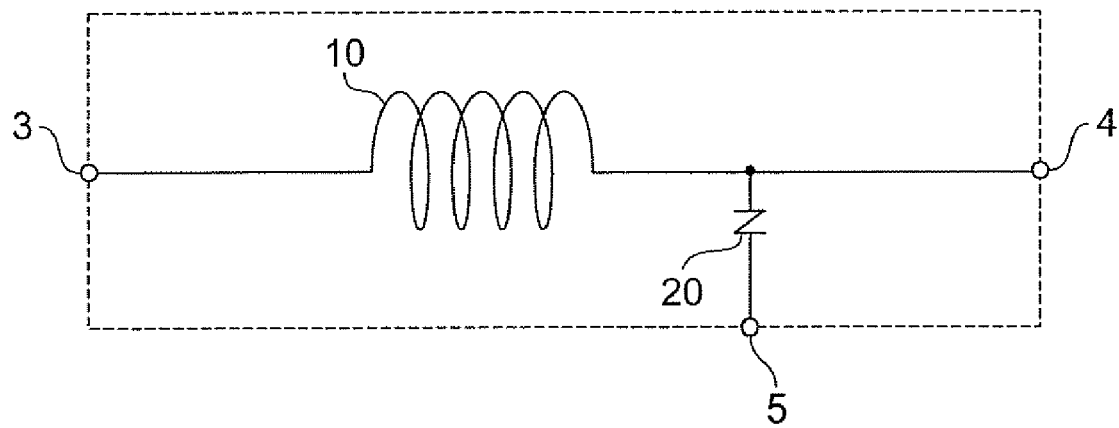
FIG. 4 is a circuit diagram of the multilayer filter according to the first embodiment.

As described above, the multilayer filter 1 constitutes an L-type circuit of the inductor 10 and the varistor 20, as shown in FIG. 4, and the inductor 10 has the DC resistance of 4Ω-100Ω. In this configuration, when noise of high voltage over the varistor voltage is applied to the input, the multilayer filter of the present embodiment is able to prevent a rapidly flowing electric current from passing as noise, by the varistor effect.

In the multilayer filter 1 of the first embodiment, as described above, the inductor multilayer section 7 and the varistor multilayer section 9 adjacent to each other contain the same component ZnO as a major ingredient, whereby delamination can be prevented between the inductor multilayer section 7 and the varistor multilayer section 9.

When Co and Al in the varistor diffusion layer 8D diffuse into the inductor diffusion layer 6D during integral sintering of the laminate 2, Co acts to increase the permittivity and Al acts to decrease the resistivity; therefore, the permittivity (or capacitance) increases and the resistivity decreases in the inductor diffusion layer 6D. This results in decreasing the inductor characteristic of the inductor multilayer section 7 and degrading the high frequency characteristic of the multilayer filter 1. It was found by the inventors' research that in this case the inductor conductor portions $12_1$-$12_8$ had to be located 100 μm or more away from the interface P, in order to suppress the degradation of the inductor characteristic of the inductor multilayer section 7.

However, since the inductor diffusion layer 6D contains Li in the multilayer filter 1 of the first embodiment, it suppresses the increase in the permittivity of the inductor diffusion layer 6D. As a result, the degradation of the inductor characteristic of the inductor multilayer section 7 due to the diffusion of Co and Al can be suppressed even if the inductor conductor portions $12_1$-$12_8$ are located as close as 20 μm from the interface P. Therefore, this multilayer filter 1 is able to suppress the degradation of the high frequency characteristic and is realized in compact size.

On the other hand, Co and Al decrease in the varistor diffusion layer 8D during the integral sintering of the inductor multilayer section 7 and the varistor multilayer section 9, so as to decrease the permittivity (or capacitance), resulting in substantially failing to exhibit the varistor function. Since the varistor conductor portions 16, 17 are located 40 μm or more away from the interface in the multilayer filter 1 of the first embodiment, the varistor conductor portions 16, 17 can be arranged away from the varistor diffusion layer 8D. It is therefore feasible to suppress the degradation of the varistor characteristic of the varistor multilayer section 9 and to suppress the degradation of the high frequency characteristic of the multilayer filter 1.

Since the thickness of the inductor conductor portion $12_8$ functioning as a lead conductor is as thick as 3 μm or more in the multilayer filter 1 of the first embodiment, Li can be made to appropriately diffuse through the clearance around the inductor conductor portion $12_8$ from the surface of the laminate 2 into the inductor diffusion layer 6D. Since there is no change in the width of the inductor conductor portion $12_8$, there is no increase in the capacitance parasitic on the inductor conductor portion $12_8$, i.e., the capacitance parasitic on the inductor conductor portions $12_1$-$12_8$. As a result, there occurs no impediment of the inductor characteristic of the inductor multilayer section 7 and no impediment of the high frequency characteristic of the multilayer filter 1.

In the above embodiment the overall size of the multilayer filter 1 was 1.0 mm in length, 0.5 mm in width, and 0.5 mm in thickness, but the overall size does not have to be limited to this size. The aforementioned effect is effective in compact multilayer filters smaller than the overall size of 3.2 mm in length, 1.6 mm in width, and 0.85 mm in thickness.

Second Embodiment

Figure 5:
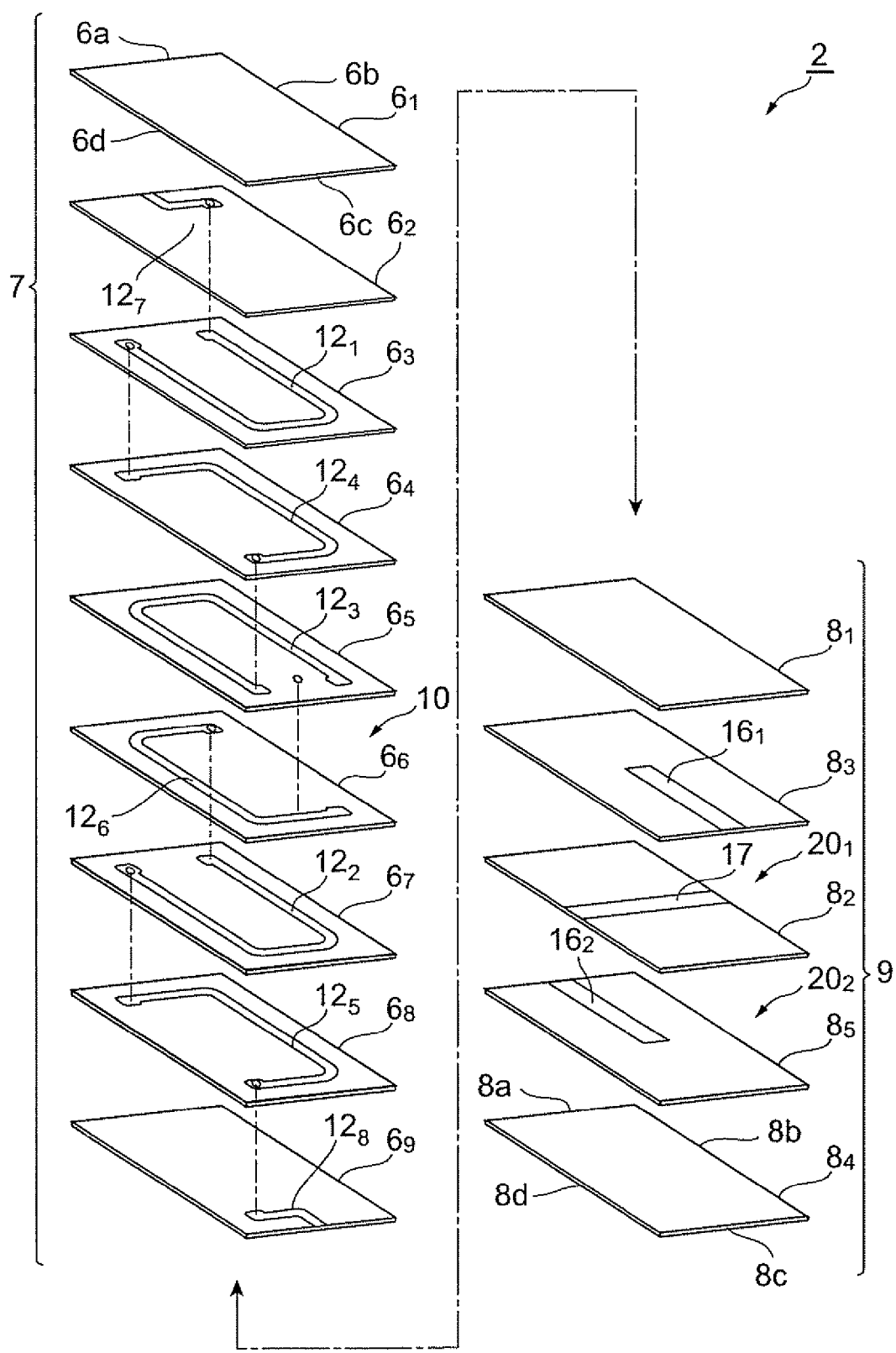
FIG. 5 is an exploded perspective view showing a separated state of a laminate of a multilayer filter according to the second embodiment.
Figure 6:
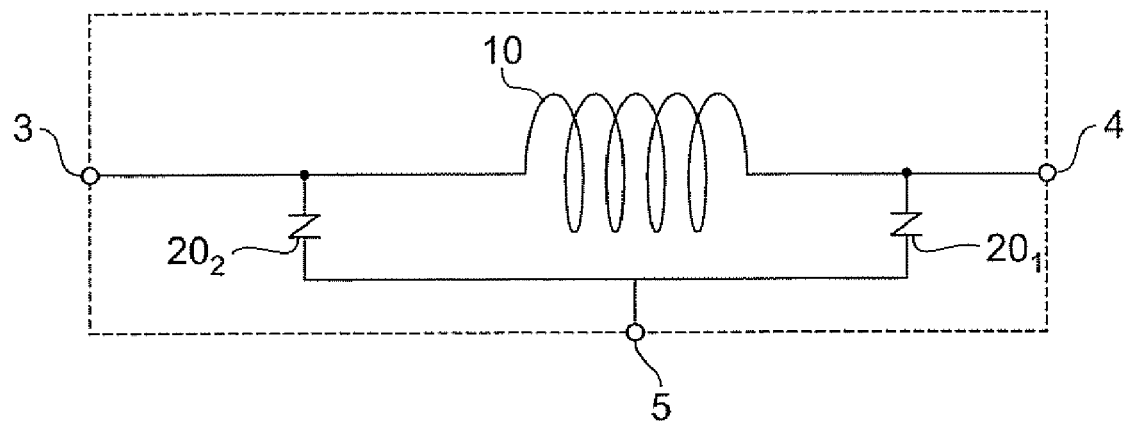
FIG. 6 is a circuit diagram of the multilayer filter according to the second embodiment.

FIG. 5 is an exploded perspective view showing a separated state of the laminate of the multilayer filter according to the second embodiment and FIG. 6 a circuit diagram of the multilayer filter according to the second embodiment. The multilayer filter 1 of the second embodiment is different in the configuration of the varistor 20 from the multilayer filter 1 of the first embodiment.

Specifically, as shown in FIG. 5, the varistor multilayer section 9 is constructed by stacking a plurality of varistor layers $8_3$, $8_2$, $8_5$ in order between the varistor layer $8_1$ and the varistor layer $8_4$. A hot electrode $16_1$ is formed on the varistor layer $8_3$ so as to extend in the central region thereof and along the edge 8b and one end thereof reaches the edge 8c to be electrically connected to the output terminal electrode 4, and a hot electrode $16_2$ is formed on the varistor layer $8_5$ so as to extend in the central region thereof and along the edge 8b and one end thereof reaches the edge 8a to be electrically connected to the input terminal electrode 3. The ground electrode 17 is formed on the varistor layer $8_2$ so as to extend in the central region thereof and along the edge 8a and the two ends thereof reach the edge 8b and the edge 8d, respectively, to be electrically connected to the ground terminal electrodes 5.

As constructed in this manner, the multilayer filter 1 comprises a varistor $20_1$ in the structure in which the hot electrode $16_1$ electrically connected to the output terminal electrode 4 and the ground electrode 17 electrically connected to the ground terminal electrodes 5 are formed with the varistor layer $8_3$ in between in the varistor multilayer section 9, and a varistor $20_2$ in the structure in which the hot electrode $16_2$ electrically connected to the input terminal electrode 3 and the ground electrode 17 electrically connected to the ground terminal electrodes 5 are formed with the varistor layer $8_2$ in between in the varistor multilayer section 9.

In the inductor layer $6_9$ the inductor diffusion layer 6D is formed along the interface P and the inductor diffusion layer 6D contains Li. In the varistor layer $8_1$ the varistor diffusion layer 8D is formed along the interface P.

The inductor conductor portions $12_1$-$12_8$ are formed on the respective inductor layers $6_2$-$6_9$ and are formed as located 20 μm or more away from the interface P between the inductor multilayer section 7 and the varistor multilayer section 9, as in the first embodiment. Namely, the thickness D1 of the inductor layer $6_9$ is not less than 20 μm. The thickness of the inductor conductor portion $12_8$ is not less than 3 μm to facilitate the diffusion of Li from the surface of the laminate 2 into the inductor diffusion layer 6D.

The hot electrodes $16_1$, $16_2$ and the ground electrode 17 are formed on the respective varistor layers $8_3$, $8_5$, $8_2$ and are formed as located 40 μm or more away from the interface P between the inductor multilayer section 7 and the varistor multilayer section 9. Namely, the thickness D2 of the varistor layer $8_1$ is not less than 40 μm.

The multilayer filter 1 constructed as described above constitutes a π type circuit of the inductor 10 and the varistors $20_1$, $20_2$, as shown in FIG. 6. When noise of high voltage over the varistor voltage is applied to the input, the multilayer filter of the present embodiment is able to prevent a rapidly flowing electric current from passing as noise, by the varistor effect.

This multilayer filter 1 of the second embodiment also has the same advantage as the multilayer filter 1 of the first embodiment.

Third Embodiment

Figure 7:
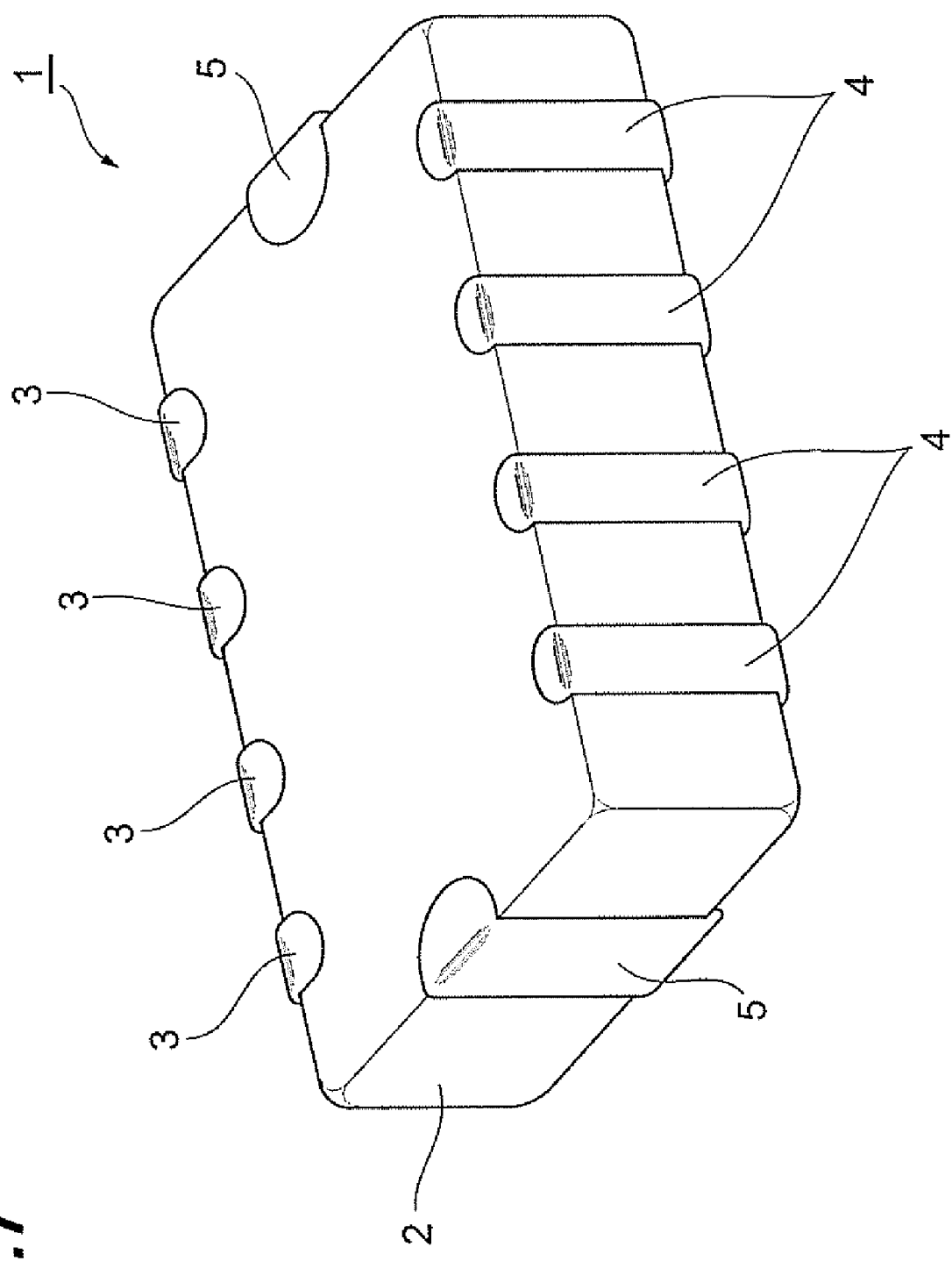
FIG. 7 is a perspective view showing a multilayer filter according to the third embodiment.
Figure 8:
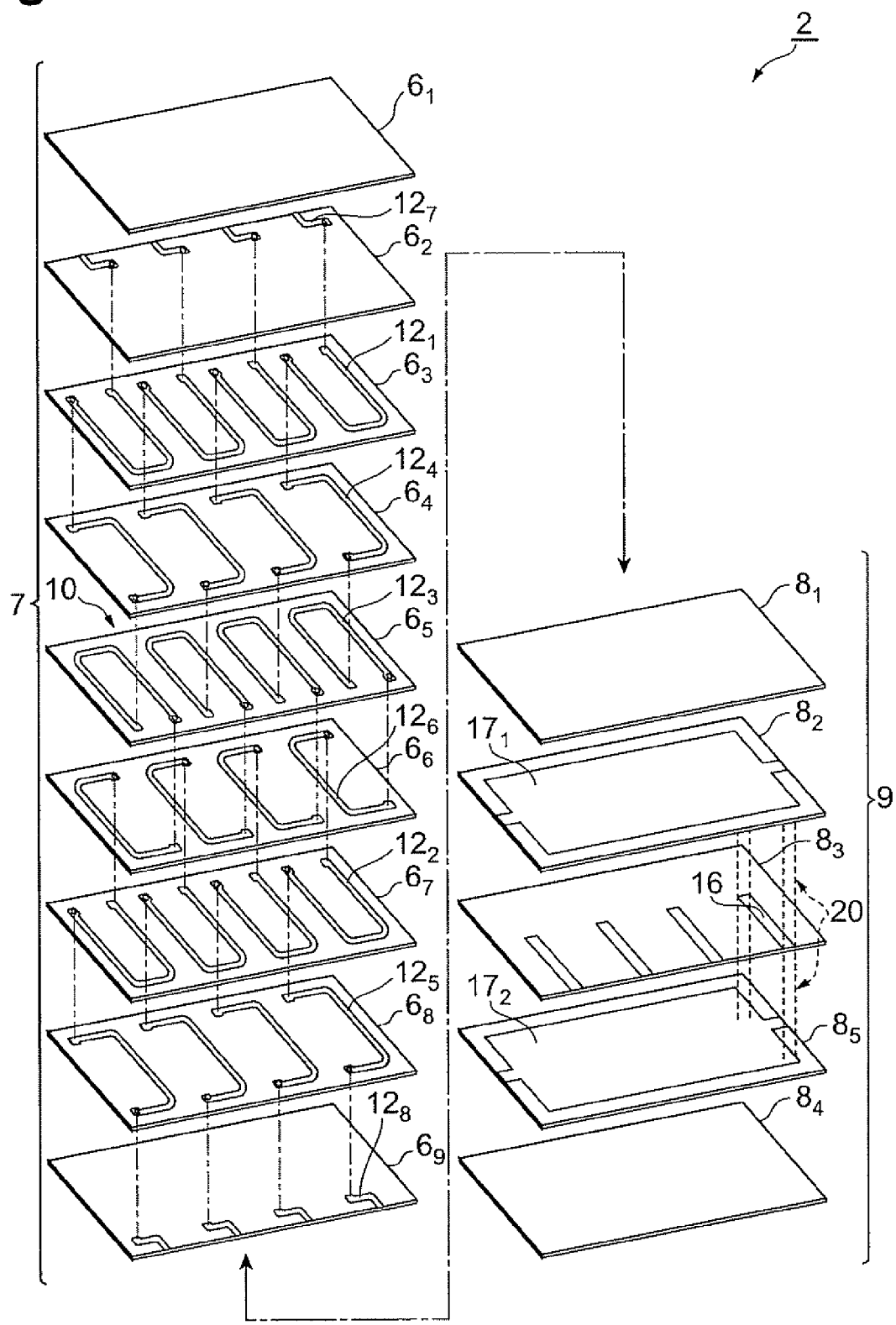
FIG. 8 is an exploded perspective view showing a separated state of a laminate of the multilayer filter according to the third embodiment.
Figure 9:
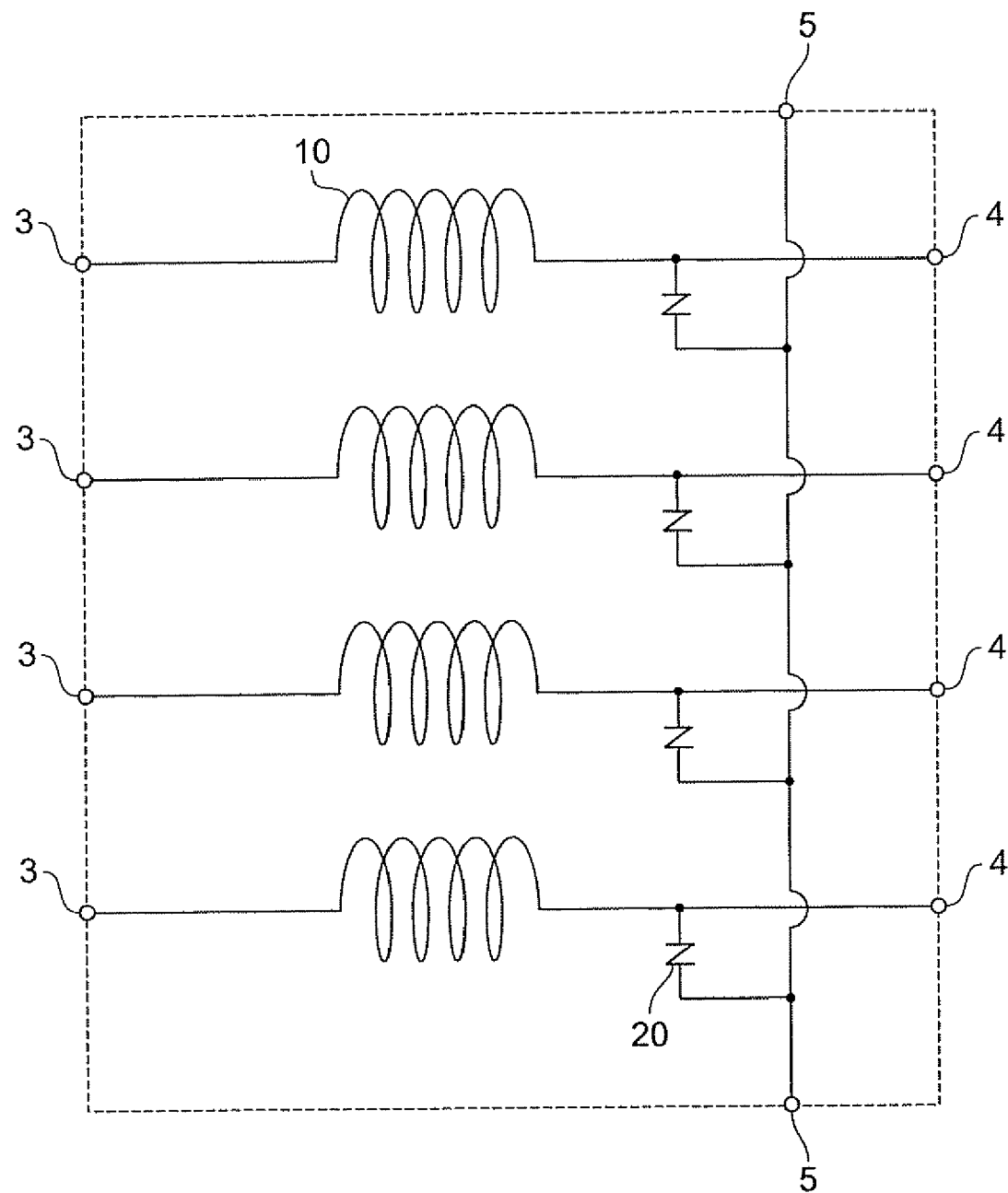
FIG. 9 is a circuit diagram of the multilayer filter according to the third embodiment.

FIG. 7 is a perspective view showing the multilayer filter according to the third embodiment and FIG. 8 an exploded perspective view showing a separated state of the laminate in the multilayer filter according to the third embodiment. FIG. 9 is a circuit diagram of the multilayer filter according to the third embodiment. The multilayer filter 1 of the third embodiment is different in arrangement in an array form from the multilayer filter 1 of the first embodiment.

Specifically, as shown in FIG. 7, the laminate 2 is formed in a structure in which four pairs of input/output terminal electrodes 3, 4 are arranged in a row on the two end faces in the direction perpendicular to the longitudinal direction thereof. As shown in FIG. 8, four sets of inductor conductor portions $12_1$-$12_8$ are arranged in a row in the inductor multilayer section 7, and four hot electrodes 16 and a pair of ground electrodes $17_1$, $17_2$ are arranged in the varistor multilayer section 9.

The varistor multilayer section 9 is constructed by stacking a plurality of varistor layers $8_2$, $8_3$, $8_5$ in order between the varistor layer $8_1$ and the varistor layer $8_4$. The four hot electrodes 16 are arranged in a row on the varistor layer $8_3$. The ground electrodes $17_1$, $17_2$ of a planar shape are formed on the varistor layers $8_2$, $8_5$, respectively. Namely, the hot electrodes 16 are interposed between the pair of ground electrodes $17_1$, $17_2$ while facing the pair of ground electrodes $17_1$, $17_2$ in the stack direction of the laminate 2.

In this configuration, four varistors 20 are formed so that each varistor is composed of the hot electrode 16 electrically connected to the output terminal electrode 4, the ground electrodes $17_1$, $17_2$ electrically connected to the ground terminal electrodes 5, and the varistor layers $8_2$, $8_3$ between these electrodes.

The inductor diffusion layer 6D is formed along the interface P in the inductor layer $6_9$ and the inductor diffusion layer 6D contains Li. The varistor diffusion layer 8D is formed along the interface P in the varistor layer $8_1$.

The inductor conductor portions $12_1$-$12_8$ are formed on the respective inductor layers $6_2$-$6_9$ and are formed as located not less than 20 μm nor more than 100 μm away from the interface P between the inductor multilayer section 7 and the varistor multilayer section 9, as in the first embodiment. Namely, the thickness D1 of the inductor layer $6_9$ is not less than 20 μm nor more than 100 μm. The thickness of the inductor conductor portion $12_8$ is not less than 3 μm to facilitate the diffusion of Li from the surface of the laminate 2 into the inductor diffusion layer 6D.

The hot electrodes 16 and the ground electrodes $17_1$, $17_2$ are formed on the varistor layers $8_2$, $8_3$, $8_5$ and are formed as located 40 μm or more away from the interface P between the inductor multilayer section 7 and the varistor multilayer section 9. Namely, the thickness D2 of the varistor layer $8_1$ is not less than 40 μm.

The multilayer filter 1 constructed as described above constitutes four sets of L-type circuits of the inductors 10 and varistors 20, as shown in FIG. 9. The multilayer filter 1 constructed in the array form as described above also achieves the damping effect.

This multilayer filter 1 of the third embodiment also has the same advantage as the multilayer filter 1 of the first embodiment.

In the multilayer filter of the array form in which a plurality of filter elements are arranged in a row, an inner filter element tends to have a larger distribution width of an electric field distribution than an outer filter element. It results in increasing element variation (interchannel variation) of parasitic capacitance and increasing element variation (interchannel variation) of high frequency characteristic.

In the multilayer filter 1 of the third embodiment, however, the separation distance between the inductor conductor portions $12_1$-$12_8$ and the interface P is short, not more than 100 μm, i.e., the separation distance between the inductor conductor portions $12_1$-$12_8$ and the varistor conductor portion $17_1$ is small, which can reduce increase in the distribution width of the electric field distribution, particularly, in the inner filter element. Therefore, it results in decreasing the element variation of parasitic capacitance value and reducing the element variation of high frequency characteristic.

In the multilayer filter 1 of the third embodiment, the hot electrodes 16 in the varistor multilayer section 9 are arranged between the pair of ground electrodes $17_1$, $17_2$, which can reduce the increase of the capacitance parasitic on the hot electrodes 16 side in the varistor multilayer section 9. As a result, the degradation of the high frequency characteristic of the multilayer filter 1 is more suppressed.

Fourth Embodiment

Figure 10:
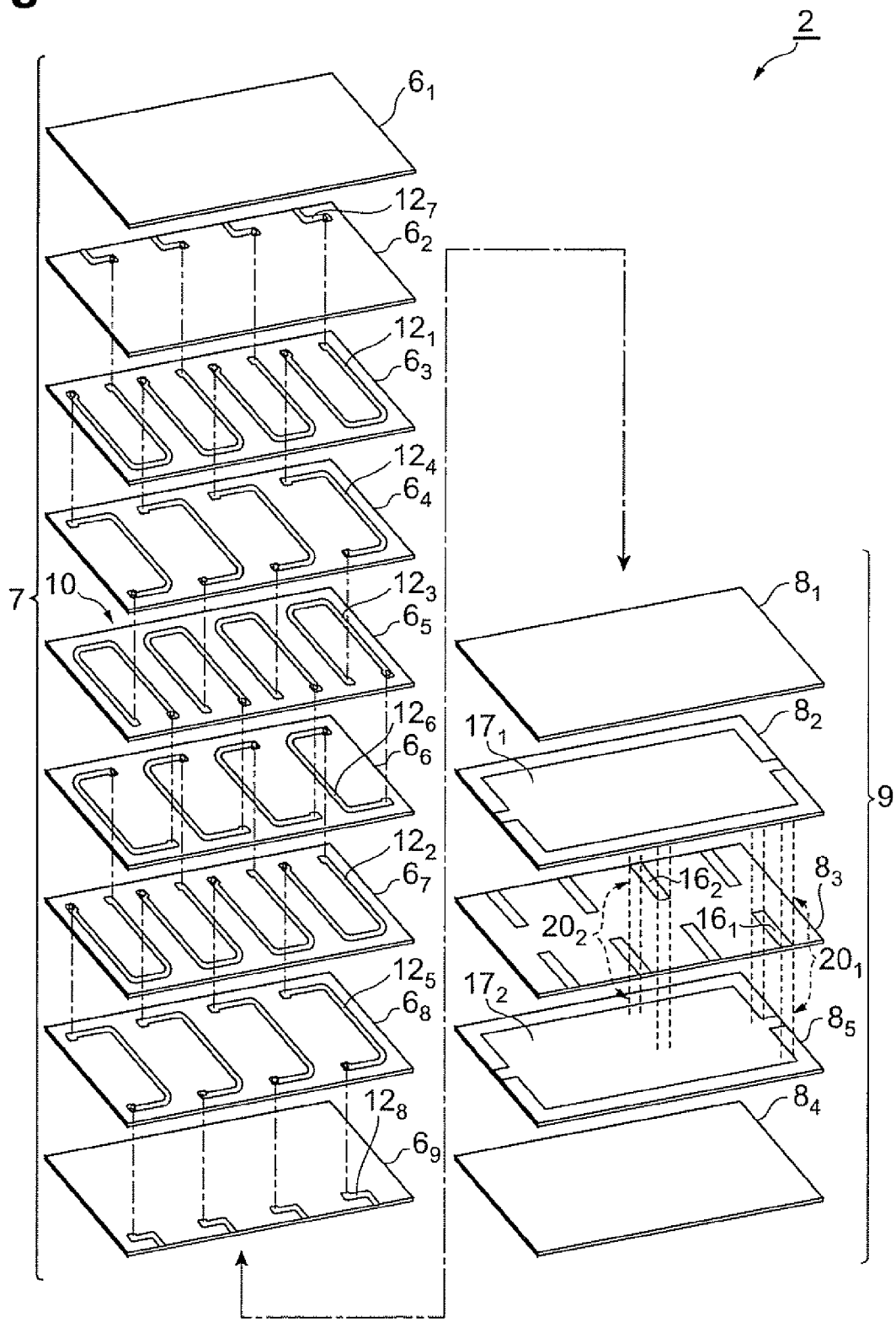
FIG. 10 is an exploded perspective view showing a separated state of a laminate of a multilayer filter according to the fourth embodiment.
Figure 11:
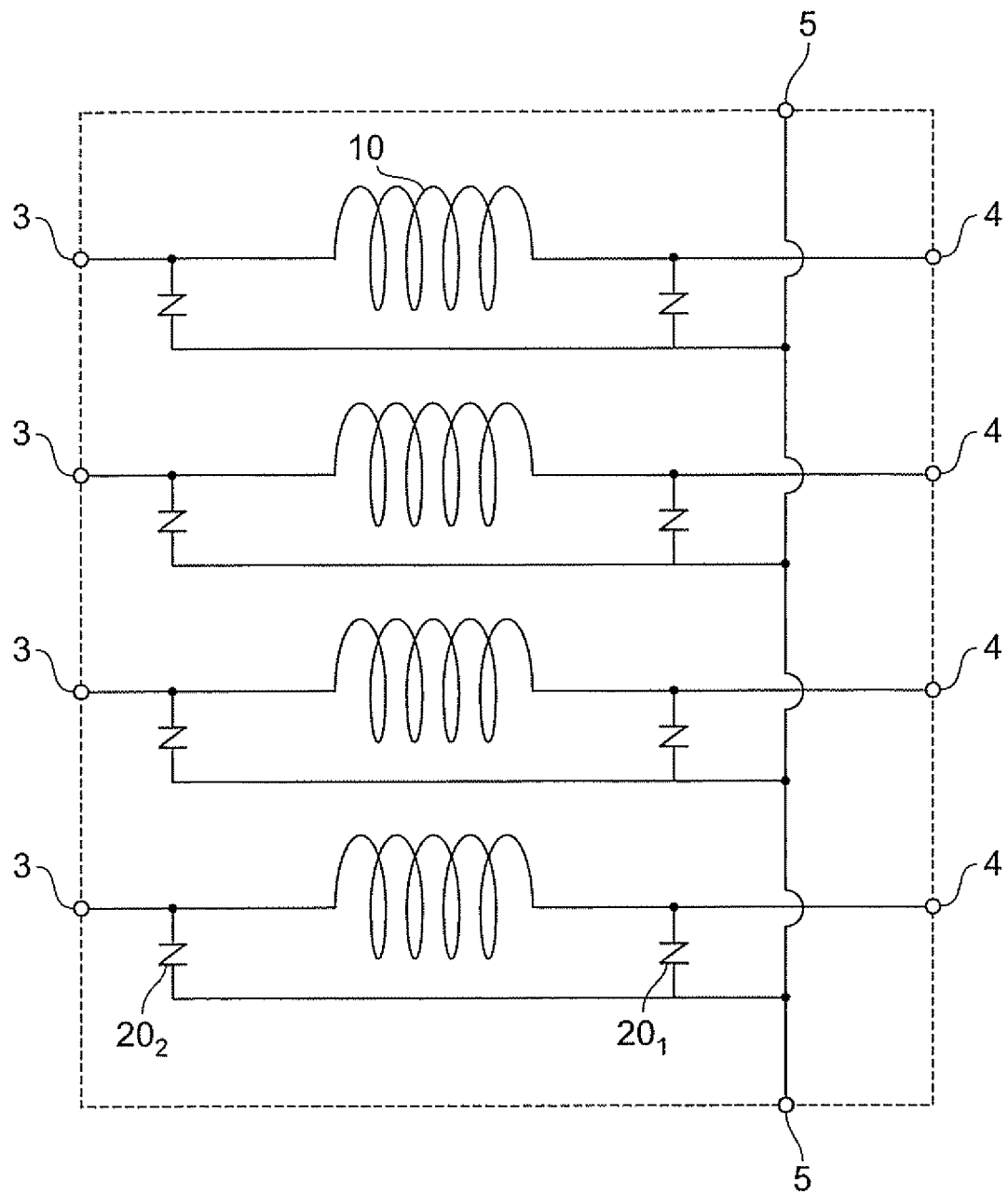
FIG. 11 is a circuit diagram of the multilayer filter according to the fourth embodiment.

FIG. 10 is an exploded perspective view showing a separated state of the laminate in the multilayer filter according to the fourth embodiment and FIG. 11 a circuit diagram of the multilayer filter according to the fourth embodiment. The multilayer filter 1 of the fourth embodiment is different in the configuration of the varistors 20 from the multilayer filter 1 of the third embodiment.

Specifically, as shown in FIG. 10, the varistor multilayer section 9 is constructed by stacking a plurality of varistor layers $8_2$, $8_3$, $8_5$ in order between the varistor layer $8_1$ and the varistor layer $8_4$. Four pairs of hot electrodes $16_1$, $16_2$ are formed on the varistor layer $8_3$. The hot electrodes $16_1$ are formed so as to extend along the edge $8b$ from the central region in the direction intersecting with the longitudinal direction on the varistor layer $8_3$ and one end of each hot electrode $16_1$ reaches the edge $8c$ to be electrically connected to the corresponding output terminal electrode 4. The hot electrodes $16_2$ are formed so as to extend along the edge $8b$ from the central region in the direction intersecting with the longitudinal direction on the varistor layer $8_3$ and one end of each hot electrode $16_2$ reaches the edge $8a$ to be electrically connected to the corresponding input terminal electrode 3. The hot electrodes $16_1$ and the hot electrode $16_2$ are located 100 μm or more away from each other in the direction intersecting with the longitudinal direction. The four pairs of hot electrodes $16_1$, $16_2$ are arranged in a row in the longitudinal direction.

The four pairs of hot electrodes $16_1$, $16_2$ are interposed between the ground electrodes $17_1$, $17_2$. It results in forming four varistors $20_1$ in the structure in which the hot electrodes $16_1$ electrically connected to the respective output terminal electrodes 4 and the ground electrodes $17_1$, $17_2$ electrically connected to the ground terminal electrodes 5 are formed with the varistor layer $8_2$ or $8_3$ in between, and four varistors $20_2$ in the structure in which the hot electrodes $16_2$ electrically connected to the respective input terminal electrodes 3 and the ground electrodes $17_1$, $17_2$ electrically connected to the ground terminal electrodes 5 are formed with the varistor layer $8_2$ or $8_3$ in between.

The inductor diffusion layer 6D is formed along the interface P in the inductor layer $6_9$ and the inductor diffusion layer 6D contains Li. The varistor diffusion layer 8D is formed along the interface P in the varistor layer $8_1$.

The inductor conductor portions $12_1$-$12_8$ are formed on the respective inductor layers $6_2$-$6_9$ and are formed as located not less than 20 μm nor more than 100 μm away from the interface P between the inductor multilayer section 7 and the varistor multilayer section 9, as in the first embodiment. Namely, the thickness D1 of the inductor layer $6_9$ is not less than 20 μm nor more than 100 μm. The thickness of the inductor conductor portion $12_8$ is not less than 3 μm so as to facilitate the diffusion of Li from the surface of the laminate 2 into the inductor diffusion layer 6D.

The hot electrodes $16_1$, $16_2$ and the ground electrodes $17_1$, $17_2$ are formed on the varistor layers $8_3$, $8_2$, $8_5$ and are formed as located 40 μm or more away from the interface P between the inductor multilayer section 7 and the varistor multilayer section 9. Namely, the thickness D2 of the varistor layer $8_1$ is not less than 40 μm.

The multilayer filter 1 constructed as described above constitutes four sets of π type circuits of the inductors 10 and the varistors $20_1$, $20_2$, as shown in FIG. 11. The multilayer filter 1 constructed in the array form as described above also achieves the damping effect.

The multilayer filter 1 of the fourth embodiment also has the same advantage as the multilayer filter 1 of the third embodiment.

In the multilayer filter 1 of the fourth embodiment, each pair of hot electrodes $16_1$, $16_2$ in the varistor multilayer section 9 in the π-type multilayer filter are arranged on the same plane on the varistor layer $8_3$, and therefore the number of layers in the varistor multilayer section 9 can be reduced. Therefore, it becomes feasible to implement further downsizing of the multilayer filter 1.

Since the pair of hot electrodes $16_1$, $16_2$ are separated 100 μm or more from each other, the increase of parasitic capacitance can be reduced between the input/output terminal electrodes 3, 4 in the π-type multilayer filter. Therefore, it can further suppress the degradation of the high frequency characteristic of the multilayer filter 1.

Fifth Embodiment

Figure 12:
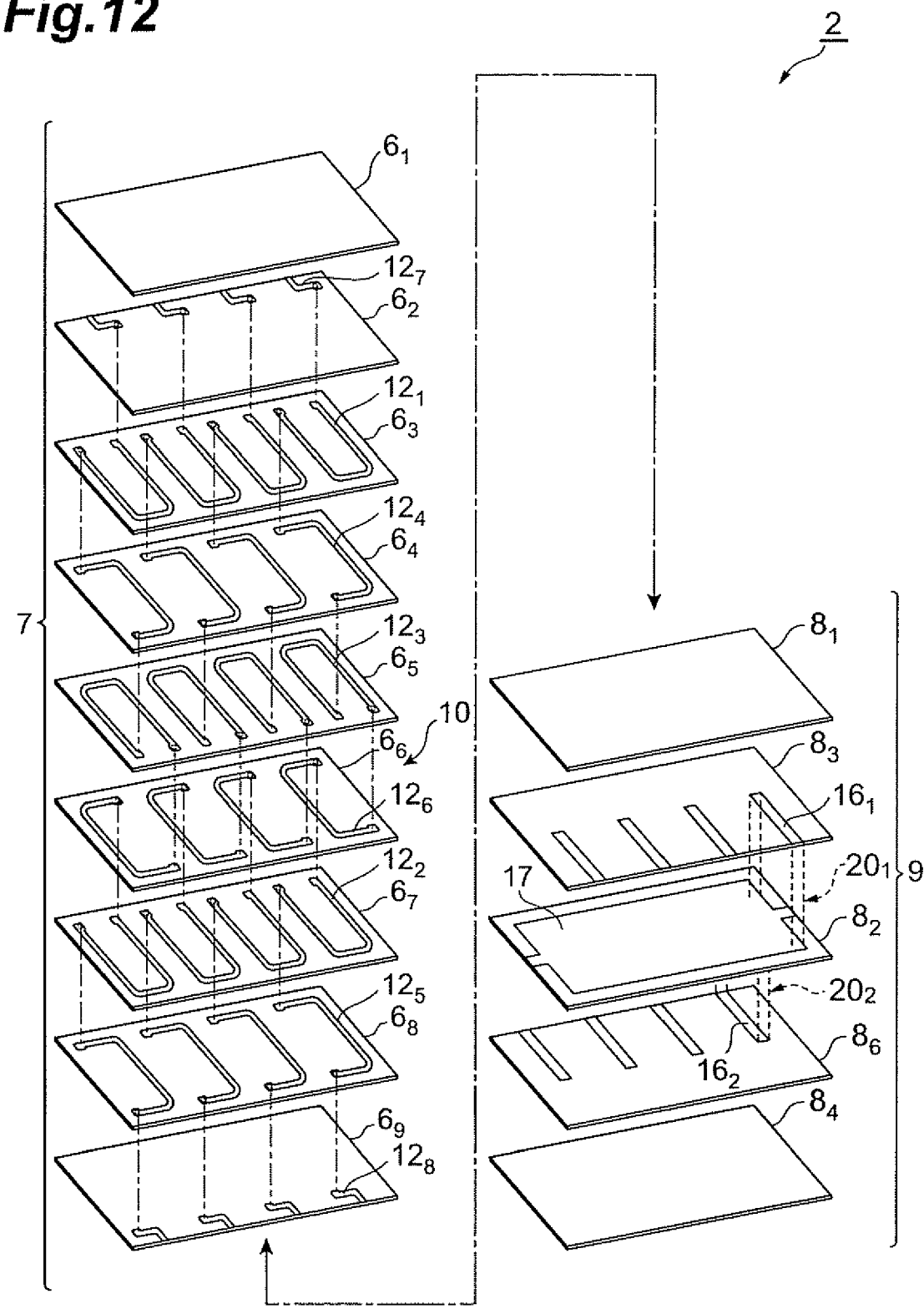
FIG. 12 is an exploded perspective view showing a separated state of a laminate of a multilayer filter according to the fifth embodiment.

FIG. 12 is an exploded perspective view showing a separated state of the laminate in the multilayer filter according to the fifth embodiment. The multilayer filter 1 of the fifth embodiment is different in the configuration of varistors 20 from the multilayer filter 1 of the fourth embodiment. In other words, the multilayer filter 1 of the fifth embodiment is different in arrangement in an array form from the multilayer filter 1 of the second embodiment.

Specifically, as shown in FIG. 12, the varistor multilayer section 9 is constructed by stacking a plurality of varistor layers $8_3$, $8_2$, $8_6$ in order between the varistor layer $8_1$ and the varistor layer $8_4$. Four hot electrodes $16_1$ are arranged in a row on the varistor layer $8_3$ and four hot electrodes $16_2$ are arranged in a row on the varistor layer $8_6$. The ground electrode 17 of a planar shape is formed on the varistor layer $8_2$.

This results in forming four varistors $20_1$ in the structure in which the hot electrodes $16_1$ electrically connected to the respective output terminal electrodes 4 and the ground electrode 17 electrically connected to the ground terminal electrodes 5 are formed with the varistor layer $8_3$ in between, and four varistors $20_2$ in the structure in which the hot electrodes $16_2$ electrically connected to the respective input terminal electrodes 3 and the ground electrode 17 electrically connected to the ground terminal electrodes 5 are formed with the varistor layer $8_2$ in between.

The inductor diffusion layer 6D is formed along the interface P in the inductor layer $6_9$ and the inductor diffusion layer 6D contains Li. The varistor diffusion layer 8D is formed along the interface P in the varistor layer $8_1$.

The inductor conductor portions $12_1$-$12_8$ are formed on the respective inductor layers $6_2$-$6_9$ and are formed as located not less than 20 μm nor more than 100 μm away from the interface P between the inductor multilayer section 7 and the varistor multilayer section 9, as in the first embodiment. Namely, the thickness D1 of the inductor layer $6_9$ is not less than 20 μm nor more than 100 μm. The thickness of the inductor conductor portion $12_8$ is not less than 3 μm to facilitate the diffusion of Li from the surface of the laminate 2 into the inductor diffusion layer 6D.

The hot electrodes $16_1$, $16_2$ and the ground electrodes $17_1$, $17_2$ are formed on the varistor layers $8_3$, $8_2$, $8_5$ and are formed as located 40 μm or more away from the interface P between the inductor multilayer section 7 and the varistor multilayer section 9. Namely, the thickness D2 of the varistor layer $8_1$ is not less than 40 μm.

The multilayer filter 1 constructed as described above constitutes four sets of π type circuits of the inductors 10 and the varistors $20_1$, $20_2$, as shown in FIG. 11. The multilayer filter 1 constructed in the array form as described above also achieves the damping effect.

The multilayer filter 1 of the fifth embodiment also has the same advantage as the multilayer filter 1 of the fourth embodiment.

It should be noted that the present invention is not limited to the above-described embodiments but can be modified in various ways.

EXAMPLES

The present invention will be described below in further detail with examples, but the present invention is by no means intended to be limited to the examples.

Example 1

Production of Multilayer Filters

First, samples of multilayer filters were produced according to the aforementioned production method of multilayer filter 1. As a first step, we prepared a paste for formation of varistor layers containing ZnO and additives of $Pr_6O_{11}$, CoO, $Cr_2O_3$, $CaCO_3$, $SiO_2$, $K_2CO_3$, and $Al_2O_3$ and a paste for formation of inductor layers containing ZnO and additives of $Pr_6O_{11}$, $Cr_2O_3$, $CaCO_3$, $SiO_2$, and $K_9CO_3$.

Subsequently, these pastes were used to produce varistor green sheets and inductor green sheets. Thereafter, a conductor paste for formation of the hot electrode and ground electrode (varistor conductor portions) or for formation of inductor conductors (inductor conductor portions) was applied onto each sheet by screen printing to obtain the pattern as shown in FIG. 2. The paste for formation of the hot electrode, the ground electrode, and the inductor conductors was one containing Pd as a major ingredient.

Then the sheets with the conductor paste (varistor green sheets and inductor green sheets) were stacked in the order shown in FIG. 2, pressed under pressure, and baked to form the laminate. Thereafter, a Li compound was attached to the surface of this laminate and a thermal treatment was conducted to diffuse Li through the clearance around the lead conductor in the inductor conductors, from the surface of the laminate into the inductor diffusion layer. Then a Ag paste was printed and baked on this laminate to form the input/output electrodes and the ground electrodes, thereby obtaining each sample of the multilayer filter having the structure shown in FIGS. 1, 2, and 3.

Figure 13:
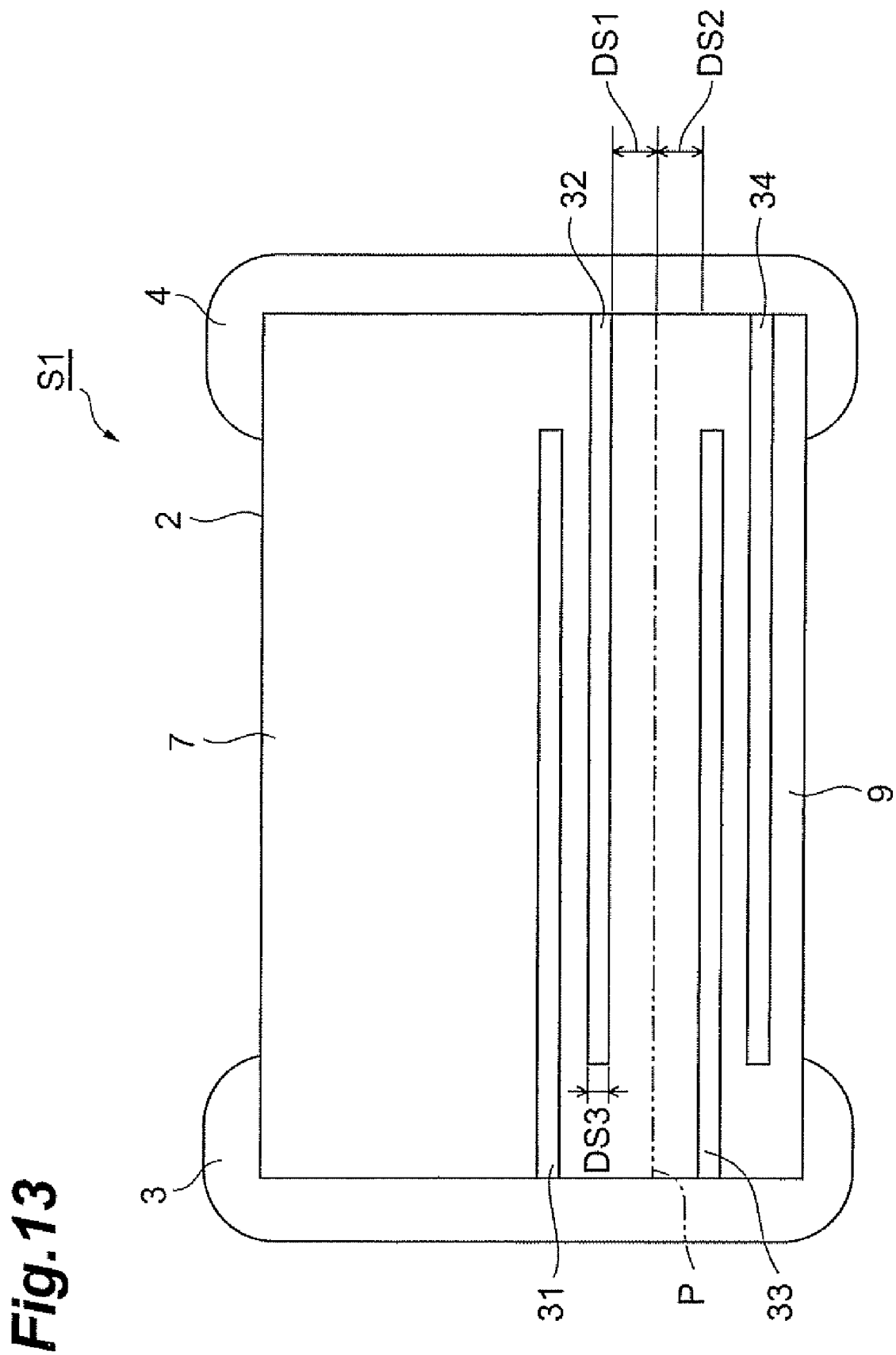
FIG. 13 is a drawing schematically showing a sectional structure of multilayer filters in Example 1 in a state in which an inductor multilayer section and a varistor multilayer section are provided with two pairs of internal electrodes for evaluation.

In this Example 1, multilayer filters S1 for evaluation were fabricated, for characteristic evaluation of permittivity in the inductor multilayer section 7 and the varistor multilayer section 9. Specifically, a pair of internal electrodes parallel in the stack direction were provided in each of the inductor multilayer section 7 and the varistor multilayer section 9 in each multilayer filter to fabricate a multilayer filter S1. FIG. 13 is a drawing schematically showing a sectional structure of the multilayer filters S1 in a state in which the two pairs of internal electrodes are provided in the inductor multilayer section and the varistor multilayer section. In FIG. 13, the inductor conductor portions and the varistor electrode pair are omitted from the illustration.

A pair of internal electrodes 31, 32 are formed in the inductor multilayer section 7. The internal electrode 32 is formed on the varistor multilayer section 9 side. The internal electrode 31 is provided so as to be exposed in the surface of the laminate 2 where the input terminal electrode 3 is formed, and the internal electrode 31 is electrically connected to the input terminal electrode 3. The internal electrode 32 is provided so as to be exposed in the surface of the laminate 2 where the output terminal electrode 4 is formed, and the internal electrode 32 is electrically connected to the output terminal electrode 4. The internal electrodes 31, 32 are arranged in no contact with the inductor conductor portions.

A pair of internal electrodes 33, 34 are formed in the varistor multilayer section 9. The internal electrode 33 is formed on the inductor multilayer section 7 side. The internal electrode 33 is provided so as to be exposed in the surface of the laminate 2 where the input terminal electrode 3 is formed, and the internal electrode 33 is electrically connected to the input terminal electrode 3. The internal electrode 34 is provided so as to be exposed in the surface of the laminate 2 where the output terminal electrode 4 is formed, and the internal electrode 34 is electrically connected to the output terminal electrode 4. The internal electrodes 33, 34 are arranged in no contact with the varistor electrode pair.

A plurality of multilayer filters S1 were prepared by changing the distance DS1 between the internal electrode 32 formed on the varistor multilayer section 9 side in the inductor multilayer section 7, and the interface P, and the thickness of the internal electrode 32. Furthermore, a plurality of multilayer filters S1 were also prepared by changing the distance DS2 between the internal electrode 33 on the inductor multilayer section 7 side in the varistor multilayer section 9, and the interface P. Each of the multilayer filters S1 was formed with the same distance and the same overlap area between the internal electrode 31 and the internal electrode 32, and the same distance and the same overlap area between the internal electrode 33 and the internal electrode 34.

(Evaluation of Permittivity of Inductor Multilayer Section and Varistor Multilayer Section)

The capacitance was measured with the internal electrodes formed in each multilayer filter S1. The capacitance was measured under the conditions of 1 MHz and the input signal level (measurement voltage) of 1 Vrms with an impedance analyzer (4284A available from Hewlett-Packard Ltd.). The relative permittivity between each pair of internal electrodes can be evaluated from the value of capacitance C according to the equation of $\epsilon'=Cd/\epsilon_0 S$. In the equation, $\epsilon_0$ is the permittivity of vacuum, d the distance between a pair of internal electrodes, and S the overlap area between a pair of internal electrodes.

The results of the above measurement are shown in FIGS. 14 and 15. FIG. 14 is a drawing showing relations between the distance DS1 between the internal electrode 32 in the inductor multilayer section 7 and the interface P and the capacitance dependent on the relative permittivity of the inductor layer between the internal electrode 32 and the internal electrode 31, using the thickness DS3 of the internal electrode 32 as a parameter FIG. 15 is a drawing showing a relation between the distance DS2 between the internal electrode 33 in the varistor multilayer section 9 and the interface P and the capacitance dependent on the relative permittivity of the inductor layer between the internal electrode 33 and the internal electrode 34.

As shown in FIG. 14, when the thickness DS3 of the internal electrode 32 is as small as 1.1 μm, the capacitance is relatively high and the change in permittivity is relatively large to the values of distance DS1. It is presumed from this result that in the inductor multilayer section 7 the diffusion of Li is little from the surface of the laminate 2 into the inductor diffusion layer 6D and thus the content of Li is small in the inductor diffusion layer 6D, so as to cause a substantial impediment of the function of the inductor layer. In this case, in order to keep the value of capacitance relatively low and stable relative to the values of distance DS1, the distance DS1 needs to be increased to 88 μm and, more preferably, to 97 μm. Namely, the distance from the interface P needs to be not less than 100 μm in the inductor multilayer section 7.

On the other hand, as the thickness DS3 of the internal electrode 32 becomes larger, 1.9 µm, 2.8 µm, or 4.4 µm, the capacitance becomes relatively lower and the change in permittivity becomes smaller relative to the values of distances DS1. At the thickness DS3=2.8 µm, the capacitance is relatively low and stable against the values of distance DS1 even if the distance DS1 is decreased to 20 µm. It is presumed from this result that in the inductor multilayer section 7 the diffusion of Li is appropriately effected from the surface of the laminate 2 into the inductor diffusion layer 6D and the content of Li in the inductor diffusion layer 6D becomes appropriate, so as to suppress the degradation of the function of the inductor layer. Namely, when the inductor multilayer section 7 has the inductor layer wherein the thickness of the lead conductor portion $12_8$ among the inductor conductor portions $12_1$-$12_8$ is not less than 3 µm and wherein the distance from the interface P is not less than 20 µm, the value of relative permittivity is low and stable against the distance from the interface P.

As shown in FIG. 15, when the distance DS2 is in the range of 0-27 µm, the capacitance is relatively low and the function of the varistor layer is not substantially exhibited. Furthermore, the change in permittivity is large against the values of distance DS2. When the distance DS2 is not less than 40 µm, the value of capacitance is relatively high and stable against the values of distance DS2. Namely, when the varistor multilayer section 9 has the varistor layer wherein the distance from the interface P is not less than about 40 µm, the value of relative permittivity is high and stable against the distance from the interface P.

(Evaluation of Delamination Between Inductor Multilayer Section and Varistor Multilayer Section)

Each of the multilayer filters S1 was observed and no delamination was recognized between the inductor multilayer section 7 and the varistor multilayer section 9 in all the multilayer filters.

It was thus confirmed that delamination was very unlikely to occur between the varistor section and the inductor section in the multilayer filters with the varistor layers containing ZnO as a major ingredient and the additives of Pr, Co, and Al and the inductor layers containing ZnO as a major ingredient and containing no substantial amount of Co and Al. The inductor layers with the inductor conductor portions being formed in this multilayer filters had the relative permittivity of less than 50 and the resistivity of more than 1 MΩ, and it was thus confirmed that the filters were adequately applicable to practical use as inductors.

Example 2

Fabrication of Multilayer Filters

Samples of multilayer filters having the structure of the array form shown in FIGS. 7 and 8 were prepared in the same manner as in Example 1, according to the aforementioned production method of multilayer filter 1. In this Example 2, multilayer filters S2 for evaluation were also prepared for characteristic evaluation of permittivity in the inductor multilayer section 7 and the varistor multilayer section 9. Namely, as shown in FIG. 13, the multilayer filters S2 of the array form were prepared in the structure in which four sets of two pairs of internal electrodes 31-34 are arranged in a row in the inductor multilayer section 7 and the varistor multilayer section 9. The size of the multilayer filters S2 was 2.0 mm in length×1.0 mm in width×0.8 mm in thickness. The size of each hot electrode in the multilayer filters S2 was 0.6 mm×0.235 mm.

A plurality of multilayer filters S2 were prepared with change in the distance DS1 between the internal electrodes 32 formed on the varistor multilayer section 9 side in the inductor multilayer section 7 and the interface P.

(Evaluation of Permittivity of Inductor Multilayer Section and Varistor Multilayer Section)

The capacitance was measured with the internal electrodes formed in each multilayer filter S2, in the same manner as in Example 1. The results of this measurement are shown in FIG. 16. FIG. 16 is a drawing showing relations between the distance DS1 between the inductor conductor portions $12_1$-$12_8$ in the inductor multilayer section 7 and the interface P and the capacitance dependent on the relative permittivity of the inductor layer between the inductor conductor portions $12_1$-$12_8$ and the varistor conductor portions 16, 17, for respective channels (filter elements of the array form).

As shown in FIG. 16, when the distance DS1 is more than 107 µm, the interchannel variation (element variation) of capacitance is relatively large. When the distance DS1 is not more than 107 µm and, more preferably, not more than 86 µm, the interchannel variation (element variation) of capacitance is relatively small. Namely, the interchannel variation (element variation) of capacitance is relatively small when the separation distance is kept not more than 100 µm between the inductor conductor portions $12_1$-$12_8$ and the interface P in the inductor multilayer section 7.

The ground electrode in the varistor section was only one layer in the first embodiment, the second embodiment, and the fifth embodiment, but the filter may be provided with two ground electrode layers. The ground electrodes in the varistor section were the two layers in the third embodiment and the fourth embodiment, but the filter may be provided with only one ground electrode layer.

What is claimed is:

1. A multilayer filter comprising: an inductor section with an inductor conductor portion being formed in an inductor layer; and a varistor section with a varistor conductor portion being formed in a varistor layer, said inductor section and said varistor section being arranged so as to form an interface;
   wherein the varistor layer contains ZnO as a major ingredient and additives of at least one element selected from the group consisting of Pr and Bi, Co, and Al;
   wherein the inductor layer contains ZnO as a major ingredient and contains no substantial amount of Co and Al;
   wherein a diffusion layer is formed on an interface side in the inductor layer and contains Li;
   wherein a separation distance between the inductor conductor portion and the interface is 21 µm or more;
   wherein the varistor conductor portion is located 40 µm or more away from the interface; and
   wherein said Li is diffused from a surface into the diffusion layer of the inductor layer through a clearance formed around a lead conductor portion of the inductor conductor portion to the surface, the lead conductor portion having a thickness of not less than 3 µm.

2. The multilayer filter according to claim 1, wherein the separation distance between the inductor conductor portion and the interface is not more than 86 µm.

3. The multilayer filter according to claim 2, wherein the varistor conductor portion has a pair of hot electrodes connected to two ends of the inductor conductor portion, respectively, and a ground electrode, and
   wherein the pair of hot electrodes are located 100 µm or more away from each other on one plane in the varistor layer.

4. The multilayer filter according to claim 2, wherein the varistor conductor portion has a hot electrode connected to the inductor conductor portion, and a pair of ground electrodes, and wherein the hot electrode is located between the pair of ground electrodes so as to face the pair of ground electrodes in a stack direction of the inductor section and the varistor section.

5. The multilayer filter according to claim 1, wherein the varistor conductor portion has a pair of hot electrodes connected to two ends of the inductor conductor portion, respectively, and a ground electrode, and wherein the pair of hot electrodes are located 100 μm or more away from each other on one plane in the varistor layer.

6. The multilayer filter according to claim 1, wherein the varistor conductor portion has a hot electrode connected to the inductor conductor portion, and a pair of ground electrodes, and wherein the hot electrode is located between the pair of ground electrodes so as to face the pair of ground electrodes in a stack direction of the inductor section and the varistor section.

* * * * *